(12) United States Patent
Cetinoneri et al.

(10) Patent No.: US 11,050,454 B2
(45) Date of Patent: *Jun. 29, 2021

(54) RADIO FREQUENCY FRONT-END CIRCUITRY INTERMEDIATE DRIVER SYSTEMS AND METHODS

(71) Applicant: Apple Inc., Cupertino, CA (US)

(72) Inventors: Berke Cetinoneri, Santa Clara, CA (US); Ioannis Sarkas, Redwood City, CA (US); Qishan Yu, San Jose, CA (US)

(73) Assignee: Apple Inc., Cupertino, CA (US)

( * ) Notice: Subject to any disclaimer, the term of this patent is extended or adjusted under 35 U.S.C. 154(b) by 1 day.

This patent is subject to a terminal disclaimer.

(21) Appl. No.: 16/597,386

(22) Filed: Oct. 9, 2019

(65) Prior Publication Data

US 2020/0106470 A1    Apr. 2, 2020

Related U.S. Application Data

(63) Continuation of application No. 16/145,614, filed on Sep. 28, 2018, now Pat. No. 10,469,120.

(51) Int. Cl.
*H04B 1/405* (2015.01)
*H04B 1/18* (2006.01)
*H03F 3/195* (2006.01)

(52) U.S. Cl.
CPC .............. *H04B 1/405* (2013.01); *H03F 3/195* (2013.01); *H04B 1/18* (2013.01); *H03F 2200/294* (2013.01); *H03F 2200/451* (2013.01)

(58) Field of Classification Search
CPC ........... H04B 1/405; H04B 1/18; H03F 3/195; H03F 2200/451; H03F 2200/294
See application file for complete search history.

(56) References Cited

U.S. PATENT DOCUMENTS

| 7,151,759 | B1 | 12/2006 | Ryan et al. | |
|---|---|---|---|---|
| 9,665,206 | B1 * | 5/2017 | Missig | G06F 3/0441 |
| 2002/0145522 | A1 * | 10/2002 | Pembroke | G08B 21/02 340/573.1 |

(Continued)

*Primary Examiner* — Devan A Sandiford
(74) *Attorney, Agent, or Firm* — Fletcher Yoder PC

(57) ABSTRACT

Systems and methods for improving communication reliability of a radio frequency system that includes an antenna integrated circuit, which includes an antenna amplifier unit that outputs a first analog electrical signal that indicates data, a transceiver integrated circuit implemented using a first semiconductor manufacturing technique, in which the transceiver integrated circuit includes a transceiver amplifier unit that outputs a second analog electrical signal that indicates the data, and a driver integrated circuit implemented using a second semiconductor manufacturing technique. The driver integrated circuit includes an intermediate amplifier, which outputs a third analog electrical signal that indicates the data, and intermediate routing circuitry, which routes the first analog electrical signal to the intermediate amplifier and the third analog electrical signal to the transceiver integrated circuit during reception and routes the second analog electrical signal to the intermediate amplifier and the third analog electrical to the antenna integrated circuit during transmission.

20 Claims, 12 Drawing Sheets

(56) References Cited

U.S. PATENT DOCUMENTS

| | | | |
|---|---|---|---|
| 2006/0141957 A1* | 6/2006 | Fischer | H03F 3/24 |
| | | | 455/119 |
| 2006/0170451 A1* | 8/2006 | Jordanger | H03K 19/00346 |
| | | | 326/34 |
| 2006/0222100 A1* | 10/2006 | Behzad | H04B 1/005 |
| | | | 375/267 |
| 2006/0223483 A1* | 10/2006 | Behzad | H04B 1/406 |
| | | | 455/323 |
| 2006/0229039 A1 | 10/2006 | Behzad | |
| 2013/0141294 A1 | 6/2013 | Rappaport | |
| 2014/0113578 A1 | 4/2014 | Xu et al. | |
| 2015/0349729 A1 | 12/2015 | Pavao-Moreira et al. | |
| 2016/0294341 A1* | 10/2016 | McCune, Jr. | H03F 1/3205 |
| 2016/0359239 A1 | 12/2016 | Wang et al. | |

* cited by examiner

RADIO FREQUENCY FRONT-END CIRCUITRY INTERMEDIATE DRIVER SYSTEMS AND METHODS

CROSS-REFERENCE TO RELATED APPLICATION

This application is a continuation of U.S. patent application Ser. No. 16/145,614, filed Sep. 28, 2018 and entitled "RADIO FREQUENCY FRONT-END CIRCUITRY INTERMEDIATE DRIVER SYSTEMS AND METHODS," which is incorporated herein by reference in its entirety for all purposes.

BACKGROUND

The present disclosure generally relates to radio frequency systems and, more particularly, to a driver (e.g., buffer) integrated circuit (e.g., module) that may be implemented in front-end circuitry of a radio frequency system.

This section is intended to introduce the reader to various aspects of art that may be related to various aspects of the present techniques, which are described and/or claimed below. This discussion is believed to be helpful in providing the reader with background information to facilitate a better understanding of the various aspects of the present disclosure. Accordingly, it should be understood that these statements are to be read in this light, and not as admissions of prior art.

Electronic devices often include a radio frequency system to facilitate wireless data communication with another electronic device and/or a communication network, such as a Wi-Fi network and/or a cellular network. Generally, a radio frequency system may include an antenna and front-end circuitry, for example, implemented at least in part in a transceiver integrated circuit (IC). To facilitate wirelessly transmitting data, the front-end circuitry may generate an analog representation of the data as an analog electrical signal and the antenna may modulate electromagnetic (e.g., radio) waves based at least in part on the analog electrical signal. Additionally or alternatively, the antenna may output an analog representation of received (e.g., incident) electromagnetic waves as an analog electrical signal and the front-end circuitry may process the analog electrical signal, for example, to convert the analog electrical signal into a digital electrical signal to facilitate subsequent processing.

However, at least in some instances, an electronic device may be implemented such that its transceiver integrated circuit is located some distance away from an antenna, for example, when its radio frequency system includes multiple antennas implemented at disparate locations in the electronic device. In such instances, one or more electrical connectors, such as a wire, a cable, a conductive trace, and/or the like, may be communicatively coupled between the transceiver integrated circuit and the antenna. However, when an electrical signal is communicated (e.g., passed or transmitted) therethrough, an electrical connector generally introduces some amount of loss on the electrical signal, for example, due to its inherent impedance. Moreover, similar to an antenna, electromagnetic waves incident on an electrical connector may induce electrical current therein, which, at least in some instances, may introduce noise in an electrical signal concurrently being communicated through the electrical connector, for example, due to the induced electrical current distorting the electrical signal. In other words, when not properly accounted for, implementing one or more electrical connectors in a radio frequency system may affect (e.g., reduce) communication reliability (e.g., stability) provided by the radio frequency system and, thus, an electronic device in which the radio frequency system is implemented.

SUMMARY

A summary of certain embodiments disclosed herein is set forth below. It should be understood that these aspects are presented merely to provide the reader with a brief summary of these certain embodiments and that these aspects are not intended to limit the scope of this disclosure. Indeed, this disclosure may encompass a variety of aspects that may not be set forth below.

The present disclosure generally relates to radio frequency systems, which may be implemented in electronic devices to facilitate wireless data communication. More specifically, to facilitate improving communication reliability (e.g., stability), the present disclosure provides techniques for implementing and/or operating a driver integrated circuit (e.g., module) coupled between a transceiver integrated circuit (IC) and one or more antennas, for example, implemented on an antenna integrated circuit (e.g., module) coupled to the driver integrated circuit via one or more electrical connectors. In other words, in some embodiments, the transceiver integrated circuit and the driver integrated circuit may be distinct (e.g., separate) integrated circuits (e.g., chips or devices).

Additionally, the driver integrated circuit may include one or more intermediate amplifier units, for example, which each includes a selectively connectable transmit (e.g., power) amplifier and/or a selectively connectable receipt (low noise) amplifier. Additionally, the transceiver integrated circuit may include an analog-to-digital converter (ADC), a digital-to-analog converter (DAC), frequency converter circuitry, and one or more transceiver amplifier units. In other words, a first portion of radio frequency front-end circuitry may be implemented in the transceiver integrated circuit and a second portion of the radio frequency front-end circuitry may be implemented in the driver integrated circuit. Additionally, in some embodiments, a third portion (e.g., one or more antenna amplifier units and/or phase-shift circuitry) of the radio frequency front-end circuitry may be implemented in an antenna integrated circuit.

In some embodiments, implementing front-end circuitry in this manner may enable the transceiver integrated circuit and the driver integrated circuit to be implemented (e.g., manufactured) using different semiconductor manufacturing techniques, for example, which provide varying tradeoffs. As an illustrative example, the transceiver integrated circuit may be implemented using bulk complementary metal-oxide-semiconductor (CMOS) manufacturing techniques to facilitate reducing implementation associated cost (e.g., physical footprint), for example, since bulk CMOS manufacturing techniques may be suitable for processing digital electrical signals and/or more readily available compared to other semiconductor manufacturing techniques. On the other hand, the driver integrated circuit may be implemented using a different semiconductor manufacturing technique, such as a radio frequency silicon-on-insulator (RF-SOI) manufacturing technique, to facilitate improving operational efficiency and/or communication reliability, for example, since amplifiers implemented using the different semiconductor manufacturing technique may exhibit better performance (e.g., reduced power consumption and/or improved linearity) compared to amplifiers implemented using bulk CMOS manufacturing techniques.

More generally, implementing front-end circuitry in this manner may enable the driver integrated circuit to be implemented (e.g., manufactured) using a semiconductor manufacturing technique that provides radio frequency performance, which facilitates meeting (e.g., satisfying) system-level specifications (e.g., requirements). In fact, in some embodiments, the transceiver integrated circuit and the driver integrated circuit may both be implemented at least in part using bulk CMOS manufacturing techniques. To facilitate improving radio frequency performance in such embodiments, a portion of the driver integrated circuit may be implemented using a different semiconductor manufacturing technique, for example, as an embedded passive and/or a surface mounted device (SMD) or component coupled to a bulk CMOS die of the driver integrated circuit.

Additionally, in some embodiments, each intermediate amplifier unit implemented in the driver integrated circuit may be dedicated to amplifying a specific frequency component (e.g., corresponding with a frequency band or range) of analog electrical signals. For example, when a radio frequency system is implemented to communicate using a first frequency band (e.g., 28 GHz or 24.25-29.5 GHz) and a second frequency band (e.g., 39 GHz or 37-43.5 GHz), the driver integrated circuit may include a first intermediate amplifier unit implemented to amplify (e.g., apply gain to) the first frequency (e.g., 28 GHz or 24.25-29.5 GHz) component and a second intermediate amplifier unit implemented to amplify the second frequency (e.g., 39 GHz or 37-43.5 GHz) component.

Furthermore, in some embodiments, each intermediate amplifier unit may be dedicated to amplifying analog electrical signals communicated with a specific antenna integrated circuit. For example, when a radio frequency system includes a first antenna integrated circuit and a second antenna integrated circuit, the driver integrated circuit may include a first intermediate amplifier unit implemented to amplify analog electrical signals communicated with the first antenna integrated circuit and a second intermediate amplifier unit implemented to amplify analog electrical signals communicated with the second antenna integrated circuit.

Moreover, in some embodiments, each intermediate amplifier unit may be dedicated to amplifying analog electrical signals communicated via a specific data stream. For example, when a radio frequency system is implemented to communicate via a first (e.g., horizontally polarized) data stream and a second (e.g., vertically polarized) data stream, the driver integrated circuit may include a first intermediate amplifier unit implemented to amplify analog electrical signals communicated via the first data stream and a second intermediate amplifier unit implemented to amplify analog electrical signals communicated via the second data stream.

Thus, in some embodiments, a driver integrated circuit may additionally include routing circuitry, for example, which facilitates routing analog electrical signals to an appropriate intermediate amplifier unit, an appropriate antenna integrated circuit, and/or an appropriate input of the transceiver integrated circuit. In other words, in some embodiments, the intermediate routing circuitry may include one or more filters that operate separate an analog electrical signal into frequency components. Additionally, in some embodiments, the intermediate routing circuitry may include one or more splitters to that operate to supply (e.g., split) the same analog electrical signal to multiple intermediate amplifier units. Furthermore, in some embodiments, the intermediate routing circuitry may include one or more combiners that operate to combine multiple analog electrical signals into a single analog electrical signal, for example, which includes multiple different frequency components.

In some embodiments, implementing front-end circuitry in this manner may enable the gain applied to control output power to be divided (e.g., split) between the driver integrated circuit and an antenna integrated circuit. As such, gain applied at the antenna integrated circuit may be reduced, which, at least in some instances may facilitate improving communication reliability, for example, by reducing likelihood of the gain applied in the antenna integrated circuit producing noise oscillations. Moreover, in some embodiments, implementing a driver integrated circuit in this manner may facilitate compensating for connector loss on the transceiver-side of an electrical connector, which, at least in some instances may facilitate improving communication reliability, for example, by improving ability of filtering to distinguish between a data portion and a noise portion of an analog electrical signal.

BRIEF DESCRIPTION OF THE DRAWINGS

Various aspects of the present disclosure may be better understood upon reading the following detailed description and upon reference to the drawings in which.

DETAILED DESCRIPTION

Figure 1:
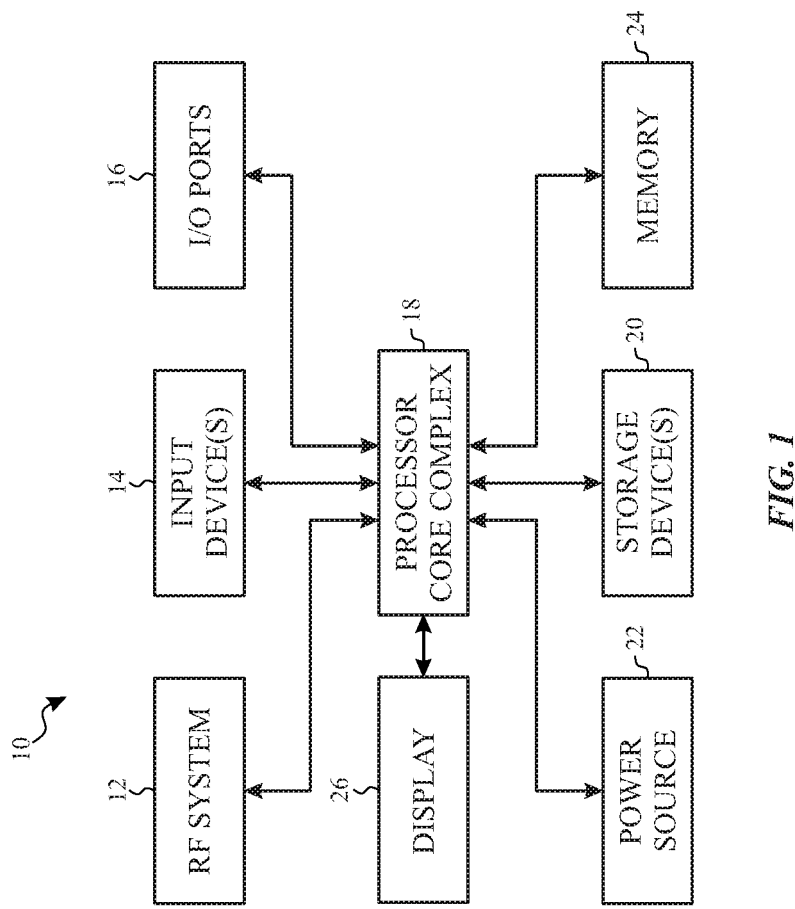
FIG. 1 is a block diagram of an electronic device including a radio frequency system, in accordance with an embodiment of the present disclosure.

One or more specific embodiments of the present disclosure will be described below. These described embodiments are only examples of the presently disclosed techniques. Additionally, in an effort to provide a concise description of these embodiments, all features of an actual implementation may not be described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but may nevertheless be a routine undertaking of design, fabrication, and manufacture for those of ordinary skill having the benefit of this disclosure.

When introducing elements of various embodiments of the present disclosure, the articles "a," "an," and "the" are intended to mean that there are one or more of the elements. The terms "comprising," "including," and "having" are intended to be inclusive and mean that there may be additional elements other than the listed elements. Additionally, it should be understood that references to "one embodiment" or "an embodiment" of the present disclosure are not intended to be interpreted as excluding the existence of additional embodiments that also incorporate the recited features.

The present disclosure generally relates to radio frequency systems, which may be implemented in electronic devices to facilitate wireless data communication. For example, a radio frequency system may facilitate wireless data communication between electronic devices. Additionally or alternatively, a radio frequency system may facilitate wireless data communication between an electronic device and a communication network, such as a Bluetooth network, a Wi-Fi network, and/or a cellular (e.g., LTE, 5G, or millimeter wave) network.

Generally, different types of communication networks may utilize different communication protocols and/or different communication (e.g., transmission and/or reception) frequencies. For example, a long-term evolution (LTE) communication network may utilize a lower communication frequency, such as an 850 MHz band, a 1900 MHz band, or a 2100 MHz band. On the other hand, a millimeter wave (mmWave) communication network (e.g., a 5G mmWave communication network) may utilize a higher communication frequency, such as a 28 GHz band (e.g., 24.25-29.5 GHz), a 38 GHz band (e.g., 37-43.5 GHz), or a 60 GHz band (e.g., 54-71 GHz). Additionally or alternatively, a millimeter wave communication network may support signal polarization, for example, to enable a first data stream to be communicated using a horizontal polarization and a second (e.g., different) data stream to be communicated using vertical polarization.

To facilitate wireless data communication, a radio frequency system generally includes one or more antennas and front-end circuitry, for example, implemented at least in part in a transceiver integrated circuit (IC). In some embodiments, a radio frequency system may be implemented with multiple antennas to enable the radio frequency system to communicate using multiple different frequencies. Additionally or alternatively, a radio frequency system may be implemented with an array of antennas, for example, which may be supplied analog electrical signals phase-shifted relative to one another to enable beam forming. Since propagation loss generally increases with communication frequency, at least in some instances, implementing beam forming techniques may facilitate overcoming propagation loss—particularly at higher communication frequencies (e.g., supported by millimeter wave communication network).

Nevertheless, operation of radio frequency systems to wirelessly communicate data may be generally similar. For example, based at least in part on received (e.g., incident) electromagnetic waves corresponding with first data, an antenna implemented in a radio frequency system may output an analog representation of the first data to front-end circuitry of the radio frequency as a first analog electrical signal. Based at least in part on the first analog electrical signal, the front-end circuitry may generate a digital representation of the first data as a first digital electrical signal, thereby wirelessly receiving the first data.

Additionally or alternatively, to wirelessly transmit second data, a radio frequency system may supply a digital representation of the second data to its front-end circuitry as a second digital electrical signal. Based at least in part on the second digital electrical signal, the front-end circuitry may generate an analog representation of the second data as a second analog electrical signal. An antenna coupled to the front-end circuitry may then may modulate electromagnetic (e.g., radio) waves based at least in part on the second analog electrical signal, thereby wirelessly transmitting the second data.

As described above, front-end circuitry in a radio frequency system may be implemented at least in part in a transceiver integrated circuit (e.g., device or chip). For example, the transceiver integrated circuit may include an analog-to-digital converter (ADC) and/or a digital-to-analog converter (DAC). However, at least in some instances, the transceiver integrated circuit may be separated from an antenna by some distance, for example, when the radio frequency system is implemented with multiple antennas positioned at disparate locations in an electronic device.

Accordingly, in such instances, one or more electrical connectors (e.g., conductive traces, wires, and/or cables) may be coupled between the transceiver integrated circuit and an antenna. For example, to facilitate improving wireless (e.g., cellular) coverage, a first antenna integrated circuit, which includes a first one or more antennas, may be positioned at a first end of the electronic device while a second antenna integrated circuit, which includes a second one or more antennas, is positioned at a second (e.g., opposite) end of the electronic device. To facilitate communicating with both the first antenna integrated circuit and the second antenna integrated circuit, the transceiver integrated circuit may be positioned at a more central location in the electronic device, communicatively coupled to the first antenna integrated circuit via a first one or more electrical connectors, and communicatively coupled to the second antenna integrated circuit via a second one or more electrical connectors.

However, similar to an antenna, electromagnetic waves incident on an electrical connector may induce electrical current in the electrical connector. In other words, when an analog electrical signal is being communicated via an electrical connector, electromagnetic waves incident on the electrical connector may produce noise in the analog electrical signal, for example, due to the induced electrical current distorting the analog electrical signal. Generally, magnitude (e.g., power) and/or frequency of noise introduced in an electrical connector is dependent on magnitude and/or frequency of the electromagnetic waves incident on the electrical connector. For example, electromagnetic waves with a frequency of 28 GHz may introduce 28 GHz noise. Additionally or alternatively, magnitude of introduced noise may increase as magnitude of the incident electromagnetic waves increases.

To facilitate reducing likelihood of noise affecting communication reliability (e.g., stability) provided by a radio frequency system, one or more filters (e.g., band-pass filters) may be implemented in its front-end circuitry, for example, to attenuate frequencies outside a target communication frequency (e.g., band). Additionally, to facilitate reducing likelihood of noise affecting communication reliability, a radio frequency system may be implemented with electromagnetic shielding disposed around (e.g., about) the electrical connectors. However, electromagnetic shielding is generally finite. In fact, at least in some instances, increasing electromagnetic shielding may affect (e.g., increase) implementation associated cost, such as component count, manufacturing steps, and/or physical size (e.g., footprint), of the radio frequency system.

Moreover, to facilitate overcoming propagation loss, front-end circuitry implemented in a radio frequency system may amplify an analog electrical signal, for example, via an amplifier unit that includes a selectively connectable transmit (e.g., power) amplifier and/or a selectively connectable receipt (e.g., low noise) amplifier. In some instances, an amplifier unit used to control magnitude of an analog electrical signal and, thus, output power of corresponding electromagnetic waves may be implemented in an antenna integrated circuit. However, at least in some instances, increasing gain applied at an antenna integrated circuit (e.g., beyond a threshold gain value) may increase likelihood of noise oscillations being produced in the antenna integrated circuit, for example, due to an in-band spur.

Moreover, since magnitude of electromagnetic waves decrease with distance squared, electromagnetic waves currently being transmitted from a radio frequency system may be a large source of noise in an analog electrical signal concurrently (e.g., simultaneously) being communicated on an electrical connector. In fact, since frequency of noise may be dependent on frequency of incident electromagnetic waves, effectiveness of filters at attenuating noise resulting from concurrently transmitted electromagnetic waves may be limited, for example, due to the noise being at the same frequency as a data portion of the analog electrical signal. Additionally or alternatively, effectiveness of filters may be limited by connector loss resulting from communication of an analog electrical signal through an electrical connector.

In particular, when an electrical signal is communicated therethrough, an electrical connector may introduce some amount of loss on the electrical signal, for example, due to its inherent impedance (e.g., resistance, capacitance, and/or inductance). When not properly compensated, at least in some instances, the connector loss may result in magnitude of a data portion of the analog electrical signal being close to magnitude of a noise portion. Unfortunately, such occurrences may make it difficult for a radio frequency system to distinguish between data and noise, which, at least in some instances may affect communication reliability of the radio frequency system.

Accordingly, to facilitate improving communication reliability, the present disclosure provides techniques for implementing and/or operating front-end circuitry in a radio frequency system that includes a driver integrated circuit (e.g., module) coupled between a transceiver integrated circuit and an antenna integrated circuit, for example, such that the driver integrated circuit, the transceiver integrated circuit, and the antenna integrated circuit are each implemented as a distinct (e.g., separate) integrated circuit (e.g., device or chip). In some embodiments, the driver integrated circuit may be coupled to the transceiver integrated circuit and a first end of an electrical connector while the antenna integrated circuit is coupled to a second (e.g., opposite) end of the electrical connector. In other words, in such embodiments, the driver integrated circuit may include one or more intermediate amplifier units implemented to supplement and/or obviate transceiver amplifier units implemented in the transceiver integrated circuit and/or antenna amplifier units implemented in the antenna integrated circuit.

In some embodiments, implementing a radio frequency system in this manner may enable different integrated circuits in its front-end circuitry to be implemented at least in part using different semiconductor manufacturing techniques. For example, the transceiver integrated circuit may be implemented using a first semiconductor manufacturing technique. On the other hand, the driver integrated circuit and/or the antenna integrated circuit may be implemented using a second (e.g., different) semiconductor manufacturing technique.

Generally, different semiconductor manufacturing techniques may provide tradeoffs. For example, bulk complementary metal-oxide-semiconductor (CMOS) manufacturing techniques may be suitable for processing digital electrical signals and/or more readily available compared to other semiconductor manufacturing techniques, such as a radio frequency (RF) silicon-on-insulator (SOI) manufacturing technique, a gallium arsenide (GaAs) manufacturing technique, a surface mounted technology (SMT) manufacturing technique, or another embedded passive manufacturing technique. However, other semiconductor manufacturing techniques may provide better amplifier performance (e.g., improved linearity and/or reduced power consumption), but increase implementation associated cost (e.g., physical footprint) compared to bulk CMOS manufacturing techniques, for example, due to the addition of one or more embedded passive layer and/or the availability of alternative semiconductor materials (e.g., gallium arsenide) compared to silicon.

Accordingly, to facilitate reducing implementation associated cost, in some embodiments, the transceiver integrated circuit may be implemented using bulk CMOS manufacturing techniques. On the other hand, to facilitate improving operational efficiency (e.g., reducing power consumption) and/or communication reliability, the driver integrated circuit and/or the antenna integrated circuit may be implemented using a semiconductor manufacturing technique other than the bulk CMOS manufacturing techniques. For example, the driver integrated circuit and/or the antenna integrated circuit may be implemented using radio frequency silicon-on-insulator (RF-SOI) manufacturing techniques.

In other embodiments, the transceiver integrated circuit and the driver integrated circuit may both be implemented at least in part using the same semiconductor manufacturing technique. For example, a first portion of the driver integrated circuit may be also be implemented using bulk CMOS manufacturing techniques and, thus, include a bulk CMOS die. To facilitate improving radio frequency performance, a second portion of the driver integrated circuit may include an embedded passive and/or a surface mounted device (SMD) or component coupled to the bulk CMOS die of the driver integrated circuit. In other words, more generally, implementing front-end circuitry in this manner may enable the driver integrated circuit to be implemented (e.g., manufactured) using a semiconductor manufacturing technique that provides radio frequency performance, which facilitates meeting (e.g., satisfying) system-level specifications (e.g., requirements).

In some embodiments, a driver integrated circuit may include multiple intermediate amplifier units, for example, which each includes a selectively connectable transmit (e.g., power) amplifier and/or a selectively connectable receipt (e.g., low noise) amplifier. Additionally, in some embodiments, each intermediate amplifier unit may be dedicated to amplifying (e.g., applying gain to) a specific frequency component of analog electrical signals. For example, when a radio frequency system is implemented to communicate using a first frequency (e.g., 28 GHz or 24.25-29.5 GHz) band and a second frequency (e.g., 28 GHz or 24.25-29.5 GHz) band, the driver integrated circuit may include a first intermediate amplifier unit implemented to amplify a first frequency component corresponding with the first frequency band and a second intermediate amplifier unit implemented to amplify a second frequency component corresponding with the second frequency band.

Furthermore, in some embodiments, each intermediate amplifier unit may be dedicated to amplifying analog electrical signals communicated with a specific antenna integrated circuit. For example, when a radio frequency system includes a first antenna integrated circuit and a second antenna integrated circuit, the driver integrated circuit may include a first intermediate amplifier unit implemented to amplify analog electrical signals communicated with the first antenna integrated circuit and a second intermediate amplifier unit implemented to amplify analog electrical signals communicated with the second antenna integrated circuit.

Moreover, in some embodiments, each intermediate amplifier unit may be dedicated to amplifying analog electrical signals communicated via a specific data stream. For example, when a radio frequency system is implemented to concurrently (e.g., substantially simultaneously) communicate via a first (e.g., horizontally polarized) data stream and a second (e.g., vertically polarized) data stream, the driver integrated circuit may include a first intermediate amplifier unit implemented to amplify analog electrical signals communicated via the first data stream and a second intermediate amplifier unit implemented to amplify analog electrical signals communicated via the second data stream.

Thus, in some embodiments, a driver integrated circuit may additionally include routing circuitry, for example, which facilitates routing analog electrical signals to an appropriate intermediate amplifier unit, an appropriate antenna integrated circuit, and/or an appropriate input of the transceiver integrated circuit. In other words, in some embodiments, the intermediate routing circuitry may include one or more filters that operate to separate an analog electrical signal into frequency components. Additionally, in some embodiments, the intermediate routing circuitry may include one or more splitters that operate to supply the same analog electrical signal to multiple intermediate amplifier units. Furthermore, in some embodiments, the intermediate routing circuitry may include one or more combiners that operate to combine multiple different frequency components into a single analog electrical signal.

As described above, in some embodiments, different portions of the driver integrated circuit may be implemented using different semiconductor manufacturing techniques. As an illustrative example, the intermediate amplifier units may be implemented using bulk CMOS manufacturing techniques and, thus, implemented via a bulk CMOS die. On the other hand, driver routing circuitry may be implemented as an embedded passive and/or a surface mounted device (SMD) or component coupled to the bulk CMOS die. To facilitate reducing noise produced in the driver integrated circuit by electromagnetic waves (e.g., interference), in some embodiments, the driver integrated circuit may include electromagnetic shielding, for example, disposed on a housing (e.g., packaging) of the driver integrated circuit distinct from a housing of the transceiver integrated circuit.

Implementing a driver integrated circuit in this manner may facilitate implementing more gain (e.g., amplification) on a transceiver-side of an electrical connector. In other words, in some embodiments, this may enable the gain applied to control output power to be divided (e.g., split) between the driver integrated circuit and the antenna integrated circuit. In particular, as described above, increasing gain applied in an antenna integrated circuit (e.g., beyond a threshold gain value) may increase likelihood of noise oscillations being produced in the antenna integrated circuit, for example, due to an in-band spur. Thus, dividing the gain between the driver integrated circuit and the antenna integrated circuit may facilitate reducing the gain applied in the antenna integrated circuit, which, at least in some instances may facilitate improving communication reliability (e.g., stability), for example, by reducing likelihood of the gain applied in the antenna integrated circuit producing noise oscillations. In other words, in some embodiments, implementing a driver integrated circuit in this manner may facilitate compensating for communication losses while also mitigating potential stability issues.

Moreover, in some embodiments, implementing a driver integrated circuit in this manner may facilitate compensating for connector loss on the transceiver-side of an electrical connector, which, at least in some instances may facilitate improving communication reliability (e.g., stability), for example, by improving ability of filtering to distinguish between a data portion and a noise portion of an analog electrical signal. Thus, as will be described in more detail below, implementing and/or operating a radio frequency system in accordance with the techniques described in the present disclosure may facilitate improving communication reliability and/or operational efficiency provided by the radio frequency system and, thus, an electronic device in which the radio frequency system is implemented.

To help illustrate, an example of an electronic device 10, which includes a radio frequency system 12, is shown in FIG. 1. As will be described in more detail below, the electronic device 10 may be any suitable electronic device, such as a computer, a mobile (e.g., portable) phone, a portable media device, a tablet device, a television, a handheld game platform, a personal data organizer, a virtualreality headset, a mixed-reality headset, a vehicle dashboard, and/or the like. Thus, it should be noted that FIG. 1 is merely one example of a particular implementation and is intended to illustrate the types of components that may be present in an electronic device 10.

As depicted, in addition to the radio frequency system 12, the electronic device 10 includes one or more input devices 14, one or more input/output ports 16, a processor core complex 18, one or more main memory storage devices 20, a power source 22, local memory 24, and an electronic display 26. The various components described in FIG. 1 may include hardware elements (e.g., circuitry), software elements (e.g., a tangible, non-transitory computer-readable medium storing instructions), or a combination of both hardware and software elements. It should be noted that the various depicted components may be combined into fewer components or separated into additional components. For example, the local memory 24 and a main memory storage device 20 may be included in a single memory or storage component.

Additionally, as depicted, the processor core complex 18 is operably coupled with the local memory 24 and the main memory storage device 20. Thus, in some embodiments, the processor core complex 18 may execute instruction stored in local memory 24 and/or the main memory storage device 20 to perform operations, such as instructing the radio frequency system 12 to communicate with another electronic device and/or a communication network. As such, the processor core complex 18 may include one or more general purpose microprocessors, one or more application specific processors (ASICs), one or more field programmable logic arrays (FPGAs), or any combination thereof.

In addition to instructions, the local memory 24 and/or the main memory storage device 20 may store data to be processed by the processor core complex 18. Thus, in some embodiments, the local memory and/or the main memory storage device 20 may include one or more tangible, non-transitory, computer-readable mediums. For example, the local memory 24 may include random access memory (RAM) and the main memory storage device 20 may include read only memory (ROM), rewritable non-volatile memory such as flash memory, hard drives, optical discs, and/or the like.

As depicted, the processor core complex 18 is also operably coupled with the I/O ports 16. In some embodiments, the I/O ports 16 may enable the electronic device 10 to interface with other electronic devices. For example, a portable storage device may be connected to an I/O port 16, thereby enabling the processor core complex 18 to communicate data with the portable storage device.

Additionally, as depicted, the processor core complex 18 is operably coupled to the power source 22. In some embodiments, the power source 22 may provide electrical power to one or more components in the electronic device 10, such as the processor core complex 18 and/or the radio frequency system 12. Thus, the power source 22 may include any suitable energy source, such as a rechargeable lithium polymer (Li-poly) battery and/or an alternating current (AC) power converter.

Furthermore, as depicted, the processor core complex 18 is operably coupled with the input devices 14. In some embodiments, the input device 14 may facilitate user interaction with the electronic device 10, for example, by receiving user inputs. Thus, in some embodiments, the input devices 14 may include a button, a keyboard, a mouse, a trackpad, and/or the like. Additionally, in some embodiments, the input devices 14 may include touch sensing components implemented in the electronic display 26. In such embodiments, the touch sensing components may receive user inputs by detecting occurrence and/or position of an object contacting the surface of the electronic display 26.

In addition to enabling user inputs, the electronic display 26 may display images, such as a graphical user interface (GUI) for an operating system, an application interface, a still image, or video content. As depicted, the electronic display 26 is operably coupled to the processor core complex 18. As such, the electronic display 26 may display images based at least in part on image data received from the processor core complex 18.

As depicted, the processor core complex 18 is also operably coupled with the radio frequency system 12. As described above, the radio frequency system 12 may facilitate wirelessly communication with another electronic device and/or a communication network. For example, the radio frequency system 12 may enable the electronic device 10 to communicate with a personal area network (PAN), such as a Bluetooth network, a local area network (LAN), such as an 802.11x Wi-Fi network, and/or a wide area network (WAN), such as an LTE or a millimeter wave (mmWave) cellular network. In other words, the radio frequency system 12 may enable wirelessly communicating data using various communication protocols.

Even when using different communication protocols, operational principles of radio frequency systems 12 may be generally similar. For example, the radio frequency system 12 may convert a digital electrical signal, which digitally represents data to be transmitted, into an analog electrical signal, thereby generating an analog representation of the data. Additionally, the radio frequency system 12 may amplify the analog electrical signal to a target output power, thereby generating an amplified analog electrical signal, for example, after converting the analog electrical signal from a processing (e.g., intermediate or baseband) frequency to a target communication (e.g., transmission and/or reception) frequency. Based at least in part on the amplified analog electrical signal, the radio frequency system 12 may modulate electromagnetic waves at a radio frequency, thereby wirelessly transmitting corresponding data via an electromagnetic radio frequency signal.

Additionally or alternatively, the radio frequency system 12 may generate an analog electrical signal modulated based at part on power of received (e.g., incident) electromagnetic waves, thereby indicating wirelessly received data via an analog electrical radio frequency signal. Since received electromagnetic waves often include electromagnetic interference, the radio frequency system 12 may filter and/or amplify the analog electrical radio frequency signals. Furthermore, to facilitate subsequent processing, the radio frequency system 12 may convert the analog electrical signal from the communication (e.g., transmission and/or reception) frequency to a processing (e.g., intermediate or baseband) frequency and/or to a digital electrical signal. Due to similarities in operational principles, the techniques described herein may be applicable to any suitable radio frequency system 12 regardless of communication protocol or communication frequency.

Figure 2:
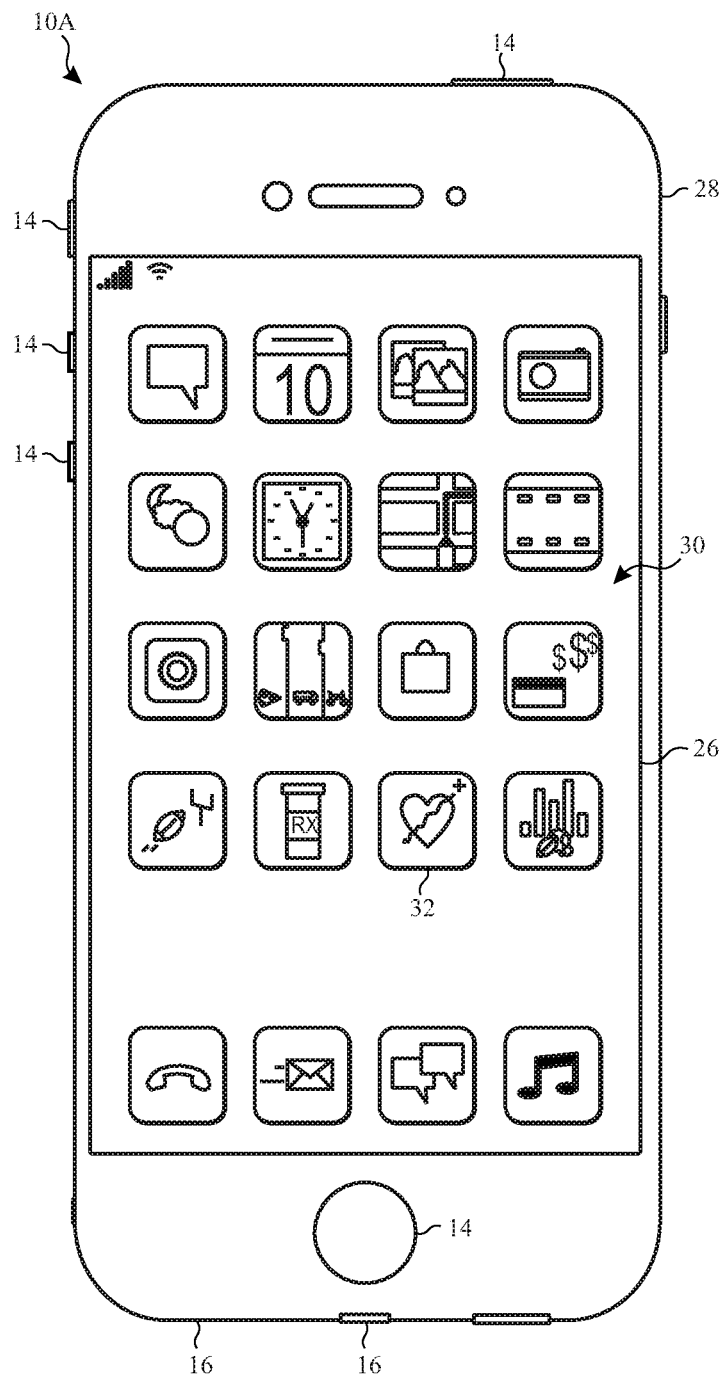
FIG. 2 is an example of the electronic device of FIG. 1, in accordance with an embodiment; of the present disclosure

As described above, the electronic device 10 may be any suitable electronic device. To help illustrate, one example of a suitable electronic device 10, specifically a handheld electronic device 10A, is shown in FIG. 2. In some embodiments, the handheld electronic device 10A may be a portable phone, a media player, a personal data organizer, a handheld game platform, and/or the like. For example, the handheld electronic device 10A may be a smart phone, such as any iPhone® model available from Apple Inc.

As depicted, the handheld electronic device 10A includes an enclosure 28 (e.g., housing). In some embodiments, the enclosure 28 may protect interior components from physical damage and/or shield them from electromagnetic interference. As such, in some embodiments, at least a portion of a radio frequency system 12 may also be enclosed within the enclosure 28 and, thus, internal to the handheld electronic device 10A.

Additionally, as depicted, the enclosure 28 may surround the electronic display 26. In the depicted embodiment, the electronic display 26 is displaying a graphical user interface (GUI) 29 having an array of icons. By way of example, when an icon is selected either by an input device 14 or a touch sensing component of the electronic display 26, an application program may launch.

Furthermore, as depicted, input devices 14 open through the enclosure 28. As described above, the input devices 14 may enable a user to interact with the handheld electronic device 10A. For example, the input devices 14 may enable the user to activate or deactivate the handheld electronic device 10A, navigate a user interface to a home screen, navigate a user interface to a user-configurable application screen, activate a voice-recognition feature, provide volume control, and/or toggle between vibrate and ring modes. As depicted, the I/O ports 16 also open through the enclosure 28. In some embodiments, the I/O ports 16 may include, for example, an audio jack to connect to external devices.

Figure 3:
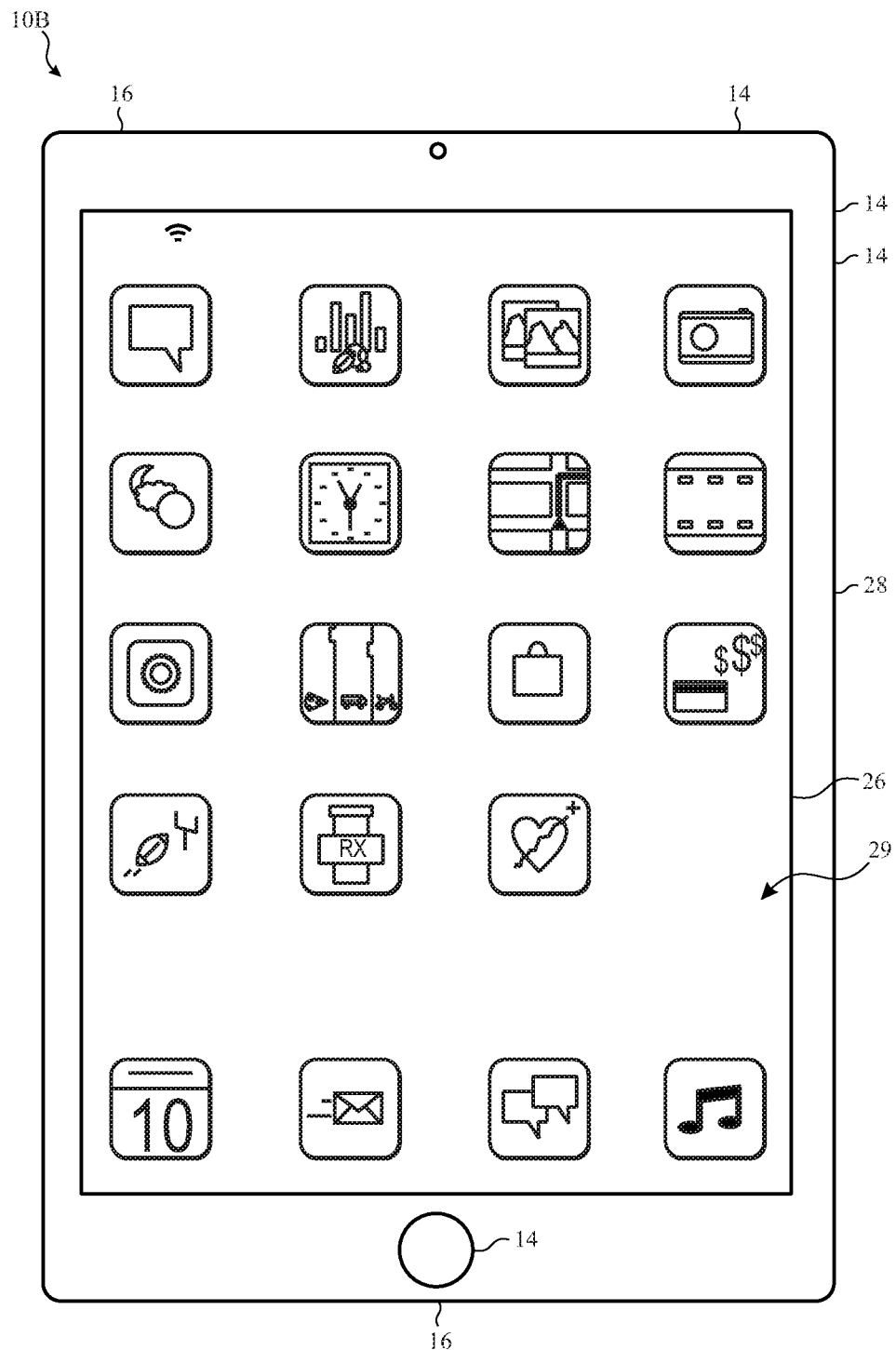
FIG. 3 is another example of the electronic device of FIG. 1, in accordance with an embodiment of the present disclosure.
Figure 4:
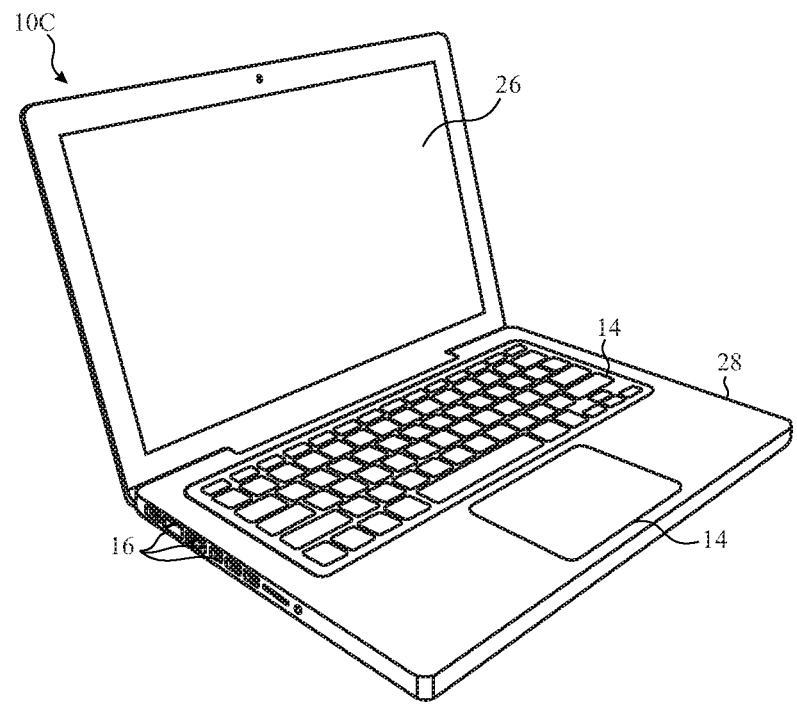
FIG. 4 is another example of the electronic device of FIG. 1, in accordance with an embodiment of the present disclosure.
Figure 5:
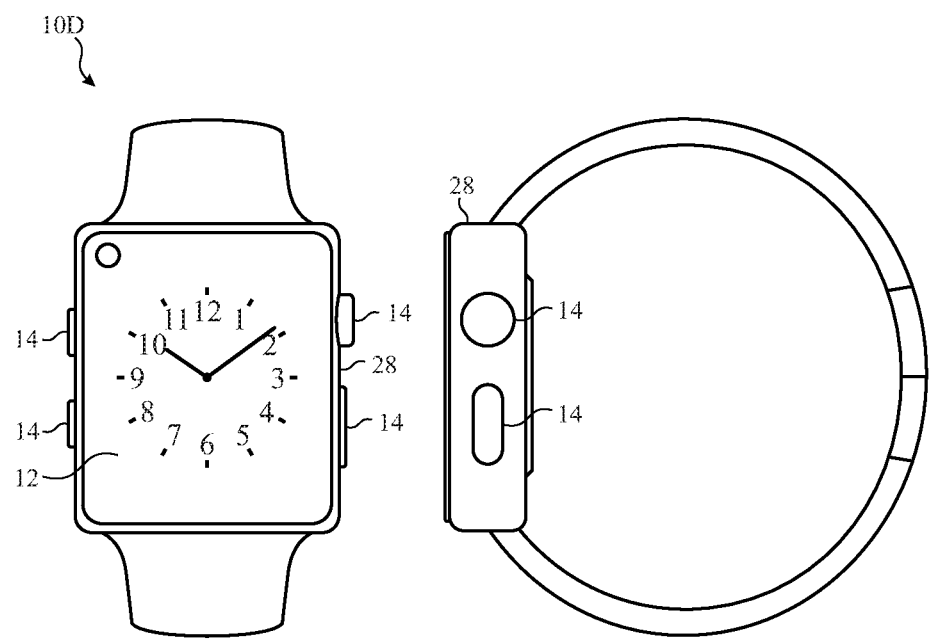
FIG. 5 is another example of the electronic device of FIG. 1, in accordance with an embodiment of the present disclosure.

To help further illustrate, another example of a suitable electronic device 10, specifically a tablet electronic device 10B, is shown in FIG. 3. As an illustrative example, the tablet electronic device 10B may be any iPad® model available from Apple Inc. A further example of a suitable electronic device 10, specifically a computer 10C, is shown in FIG. 4. As an illustrative example, the computer 10C may be any MacBook® or iMac® model available from Apple Inc. Another example of a suitable electronic device 10, specifically a watch 10D, is shown in FIG. 5. As an illustrative example, the watch 10D may be any Apple Watch® model available from Apple Inc.

As depicted, the tablet electronic device 10B, the computer 10C, and the watch 10D each also include an electronic display 26, input devices 14, I/O ports 16, and an enclosure 28. In some embodiments, at least a portion of a radio frequency system 12 may also be enclosed within the enclosure 28 and, thus, internal to the tablet electronic device 10B, the computer 10C, and/or the watch 10D. As described above, a radio frequency system 12 may facilitate wirelessly communicating data with other electronic devices and/or a communication network.

Figure 6:
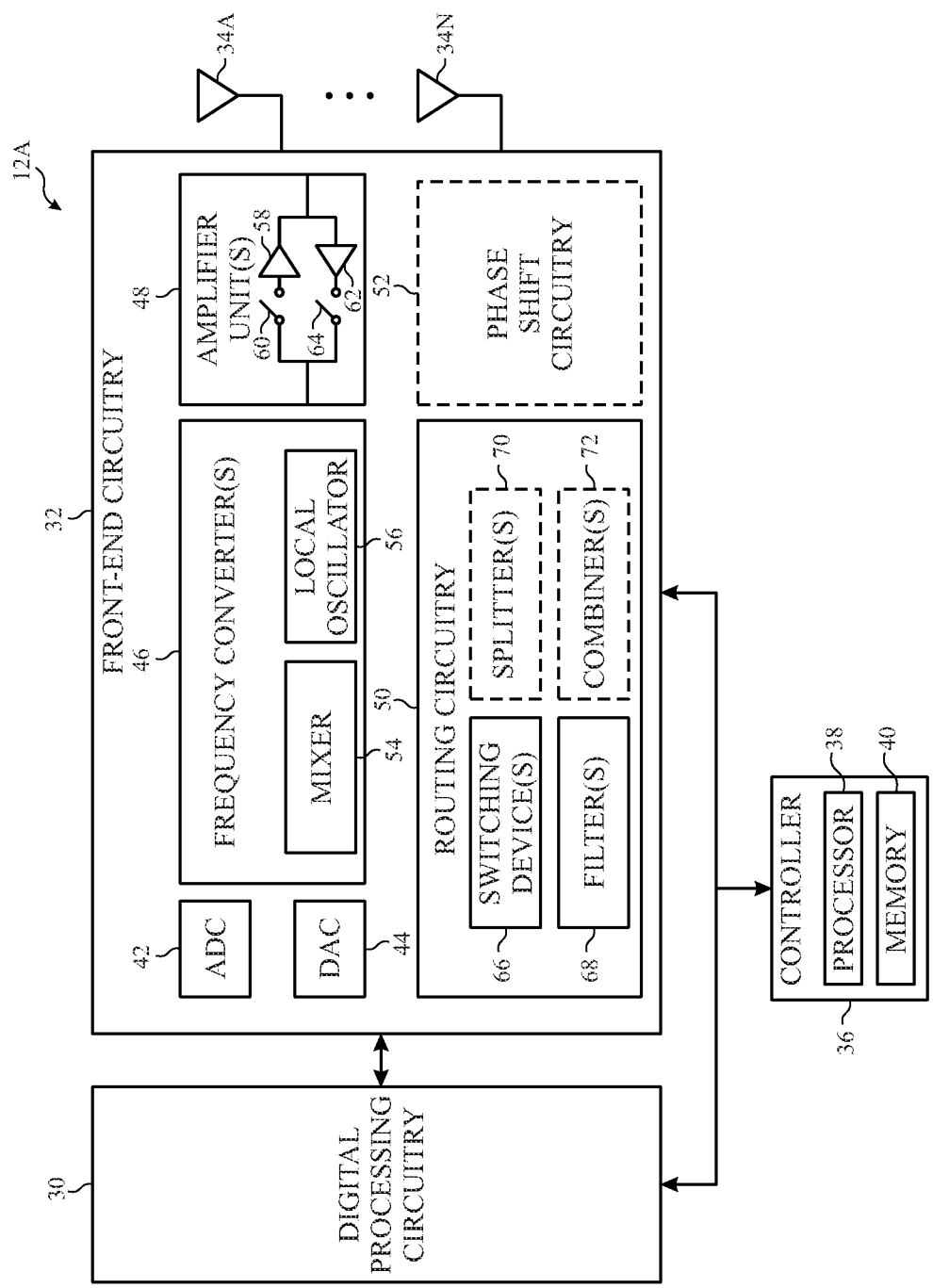
FIG. 6 is block diagram of a portion of the radio frequency system of FIG. 1 including front-end circuitry and antennas, in accordance with an embodiment of the present disclosure.

To help illustrate, an example of a radio frequency system 12A, which may be implemented in an electronic device 10, is shown in FIG. 6. As in the depicted example, a radio frequency system 12 may include digital processing circuitry 30, front-end circuitry 32, one or more antennas 34, and a controller 36. It should be appreciated that the depicted example is merely intended to be illustrative and not limiting. For example, in other embodiments, a radio frequency system 12 may include a single antenna 34 or more than two antennas 34.

The controller 36 may generally control operation of the radio frequency system 12. Although depicted as a single controller 36, in other embodiments, one or more separate controllers 36 may be used to control operation of the radio frequency system 12. To facilitate controlling operation, the controller 36 may include one or more controller processors 38 and/or controller memory 40. In some embodiments, a controller processor 38 may execute instructions and/or process data stored in the controller memory 40 to determine control commands that instruct the radio frequency system 12 to perform a control action. Additionally or alternatively, a controller processor 38 may be hardwired with instructions that determine control commands when executed. Furthermore, in some embodiments, a controller processor 38 may be included in the processor core complex 18, separate processing circuitry, or both and the controller memory 40 may be included in local memory 24, main memory storage device 20, another tangible, non-transitory computer-readable medium, or any combination thereof.

Digital processing circuitry 30 implemented in a radio frequency system 12 may generally operate in a digital domain. In other words, the digital processing circuitry 30 may process data indicated via digital electrical signals, for example, which indicate "0" bits when voltage is below a voltage threshold and "1" bits when voltage is above the voltage threshold. Thus, in some embodiments, the digital processing circuitry 30 may include a modem, a baseband processor, and/or the like. Additionally, in some embodiments, the digital processing circuitry 30 may be communicatively coupled to the processor core complex 18 to enable the electronic device 10 to wirelessly transmit data and/or receive wirelessly transmitted data via the radio frequency system 12.

On the other hand, antennas 34 implemented in a radio frequency system 12 generally operate in an analog domain. For example, an antenna 34 may facilitate wireless data transmission by modulating electromagnetic (e.g., radio) waves based at least in part on an analog electrical signal received from the front-end circuitry 32. Additionally or alternatively, an antenna 34 may facilitate wireless data reception by outputting an analog electrical signal based at least in part on received (e.g., incident) electromagnetic waves.

As described above, in some embodiments, a radio frequency system 12 may include multiple antennas 34, for example, to facilitate improving operational flexibility, communication bandwidth, transmission distance, and/or communication reliability of radio frequency system 12. As an illustrative example, a first antenna 34A may be implemented to communicate with a first (e.g., LTE) communication network while an Nth antenna 34N is implemented to communicate with a second (e.g., mmWave or different) communication network, thereby improving operational flexibility and/or communication bandwidth, for example, by enabling the radio frequency system 12 to selectively and/or concurrently (e.g., simultaneously) communicate with multiple different communication networks. Additionally or alternatively, the first antenna 34A may be implemented to communicate a first (e.g., horizontally polarized) data stream while an Nth antenna 34N is implemented to communicate a second (e.g., vertically polarized) data stream, thereby improving communication bandwidth, for example, by enabling the radio frequency system 12 to concurrently communicate multiple different data streams.

Furthermore, in some embodiments, the first antenna 34A and the Nth antenna 34N may be implemented in an antenna array, for example, to enable beam forming techniques, which, at least in some instances, may facilitate improving transmission distance and, thus, communication reliability of radio frequency system 12. Nevertheless, it should be appreciated that the depicted example is merely intended to be illustrative and not limiting. For example, in other embodiments, a radio frequency system 12 may be implemented with a single antenna 34 or more than two antennas 34.

As in the depicted example, the front-end circuitry 32 may be coupled between the digital processing circuitry 30 and the antennas 34 and, thus, may operate as an interface between the digital domain and the analog domain. For example, the front-end circuitry 32 may include an analog-to-digital converter (ADC) 42 that operates to convert an analog electrical signal (e.g., output from an antenna 34) into a digital electrical signal (e.g., to be output to the digital processing circuitry 30). Additionally, as in the depicted example, the front-end circuitry 32 may include a digital-to-analog converter (DAC) 44 that converts a digital electrical signal (e.g., output from the digital processing circuitry 30) into an analog electrical signal (e.g., to be output to an antenna 34).

In addition to the analog-to-digital converter 42 and the digital-to-analog converter 44, as in the depicted example, the front-end circuitry 32 may include one or more frequency converters 46, one or more amplifier (e.g., buffer) units (e.g., assemblies or devices) 48, and routing circuitry 50. In some embodiments, the radio frequency system 12 may also include phase shift circuitry 52, for example, to facilitate implementing beam forming techniques. In other words, in other embodiments, the phase shift circuitry 52 may be obviated (e.g., optional), for example, when the radio frequency system 12 does not implement beam forming techniques.

A frequency converter 46 implemented in front-end circuitry 32 of a radio frequency system 12 generally operates to convert an analog electrical signal from a first frequency to a second (e.g., different) frequency. For example, a frequency converter 46 may convert between a processing (e.g., baseband) frequency used by the digital processing circuitry 30 and a communication (e.g., carrier) frequency used by an antenna 34. Additionally or alternatively, a first frequency converter 46 may convert between the processing frequency and an intermediate frequency, which is between the processing frequency and the communication frequency, while a second frequency converter 46 converts between the intermediate frequency and the communication frequency.

To facilitate converting frequency, as in the depicted example, a frequency converter 46 may include a mixer 54 and a local oscillator 56. In some embodiments, the local oscillator 56 may generate a local oscillator signal, for example, with a frequency that matches a target frequency to which an analog electrical signal is to be converted. Based at least in part on the local oscillator signal, the mixer 54 may up convert or down convert frequency of an analog electrical signal, for example, by modulating the local oscillator signal based on the analog electrical signal.

Additionally, an amplifier unit 48 implemented in front-end circuitry 32 of a radio frequency system 12 generally operates to amplify magnitude (e.g., amplitude) of an analog electrical signal, for example, to facilitate overcoming communication (e.g., propagation and/or connector) loses. Thus, as in the depicted example, an amplifier unit 48 may include a transmit (e.g., power) amplifier 58 selectively connectable via a transmit amplifier (e.g., first) switching device 60 and a receipt (e.g., low noise) amplifier 62 selectively connectable via a receipt amplifier (e.g., second) switching device 64. In some embodiments, the transmit amplifier switching device 60 and/or the receipt amplifier switching device 64 may be a semiconductor switching device, such as a metal-oxide-semiconductor field-effect transistor (MOSFET).

However, it should again be appreciated that the depicted example is merely intended to be illustrative and not limiting. For example, in some embodiments, front-end circuitry 32 may include one or more transmit amplifier units 48, which each includes a transmit amplifier 58 selectively connectable via a transmit amplifier switching device 60, but not a receipt amplifier 62 or a receipt amplifier switching device 64. Additionally or alternatively, front-end circuitry 32 may include one or more receipt amplifier units 48, which each includes a receipt amplifier 62 selectively connectable via a receipt amplifier switching device 64, but not a transmit amplifier 58 or a transmit amplifier switching device 60. Furthermore, in some embodiments, an amplifier unit 48 may include a selectively connectable bypass path, which bypasses its transmit amplifier 58 and/or its receipt amplifier 62 when connected.

As described above, routing circuitry 50 implemented in front-end circuitry 32 of a radio frequency system 12 generally operates to route analog electrical signals to appropriate destinations in the radio frequency system 12. To facilitate routing, as in the depicted example, the routing circuitry 50 may include one or more routing switching devices 66 and/or one or more filters 68. In some embodiments, one or more of the routing switching devices 66 may be implemented in a multiplexer or a de-multiplexer. Additionally, in some embodiments, the routing switching devices 66 may include a time division duplex (TDD) switch or a frequency division duplex (FDD) switch, for example, which selectively switches between transmission (e.g., uplink) and reception (e.g., downlink). Furthermore, in some embodiments, one or more of the routing switching devices 66 may be a semiconductor switching device, such as a metal-oxide-semiconductor field-effect transistor (MOSFET).

As described above, in some embodiments, a filter 68 may operate to remove noise from an analog electrical signal, for example, by attenuating frequencies outside a target communication frequency band (e.g., range or spectrum). Thus, in some embodiments, the filters 68 may include one or more bandpass filters. Additionally or alternatively, a filter 68 may operate to facilitate separating an analog electrical signal into frequency components, for example, when the radio frequency system 12 is implemented to communicate a data stream via multiple different communication (e.g., transmission and/or reception) frequency bands (e.g., ranges).

When the radio frequency system 12 is implemented to communicate a data stream via multiple different communication frequency bands, in some embodiments, the routing circuitry 50 may include one or more splitters 70 and one or more combiners 72. In other words, in other embodiments, the splitters 70 and/or the combiners 72 may be obviated (e.g., optional), for example, when the radio frequency system 12 is not implemented to communicate a data stream via multiple different communication frequencies. A splitter 70 implemented in front-end circuitry 32 of a radio frequency system 12 may generally operate to supply the same analog electrical signal to multiple different destinations. On the other hand, a combiner 72 implemented in front-end circuitry 32 of a radio frequency system 12 may generally operate to combine analog electrical signals received from multiple different sources into a single analog electrical signal, for example, which includes multiple different frequency components.

As described above, in some embodiments, the front-end circuitry 32 may be implemented across multiple integrated circuits (e.g., devices or chips). For example, the analog-todigital converter 42 and the digital-to-analog converter (DAC) 44 may be implemented in a transceiver integrated circuit. Additionally or alternatively, a first one or more amplifier units 48 may be implemented in an antenna integrated circuit (e.g., module) and a second one or more amplifier units 48 may be implemented in a driver integrated circuit (e.g., module) coupled between the transceiver integrated circuit and the antenna integrated circuit.

Figure 7:
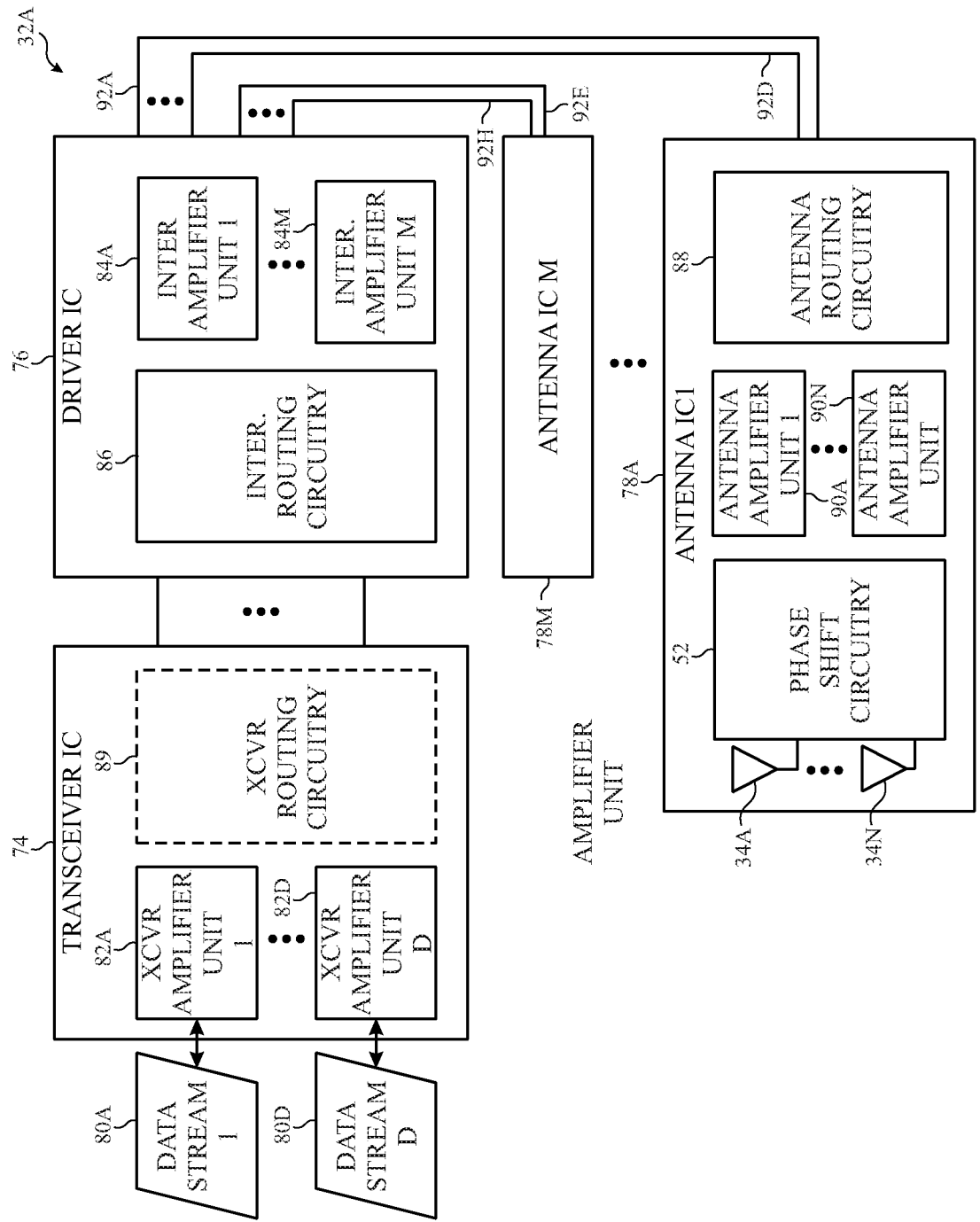
FIG. 7 is a block diagram of front-end circuitry of FIG. 6 implemented in a transceiver integrated circuit (IC), a driver integrated circuit, and multiple antenna integrated circuits, in accordance with an embodiment of the present disclosure.

To help illustrate, an example of front-end circuitry 32A, which may be implemented in a radio frequency system 12, is shown in FIG. 7. As depicted, the front-end circuitry 32A is implemented in a transceiver integrated circuit (IC) 74, a driver (e.g., buffer) integrated circuit (e.g., module) 76, and multiple antenna integrated circuits (e.g., modules) 78—namely a first antenna integrated circuit 78A and an Mth antenna integrated circuit 78M. Additionally, as in the depicted example, the front-end circuitry 32A may be implemented to enable concurrent (e.g., simultaneous) communication of multiple data streams 80—namely a first data stream 80A and a Dth data stream 80D.

However, it should be appreciated that the depicted example is merely intended to be illustrative and not limiting. For example, in other embodiments, front-end circuitry 32 may be implemented in a single antenna integrated circuit 78 or more than two antenna integrated circuits 78. Additionally or alternatively, in other embodiments, front-end circuitry 32 may be implemented to communicate a single data stream 80 or more than two data streams 80.

To enable concurrent communication of multiple data streams 80, as in the depicted example, the transceiver integrated circuit 74 may be implemented with multiple transceiver (XCVR) amplifier (e.g., buffer or driver) units 82. In some embodiments, each transceiver amplifier unit 82 may be dedicated to amplifying analog electrical signals communicated via a corresponding data stream 80. For example, the transceiver integrated circuit 74 may include a first transceiver amplifier unit 82A implemented to amplify analog electrical signals communicated via the first data stream 80A and a Dth transceiver amplifier unit 82D implemented to amplify analog electrical signals communicated via the Dth data stream 80D.

Additionally, in some embodiments, each transceiver amplifier unit 82 may be dedicated to amplifying a corresponding frequency component (e.g., band, spectrum, or range). For example, the first transceiver amplifier unit 82A may be implemented to amplify a first (e.g., 28 GHz or 24.25-29.5 GHz) frequency component in the first data stream 80A and the Dth transceiver amplifier unit 82D may be implemented to amplify the first frequency component in the Dth data stream 80D. As described above, in some embodiments, a data stream 80 may be communicated via multiple different frequency bands (e.g., components or ranges). Thus, in some embodiments, multiple transceiver amplifier units 82 may be dedicated to amplifying analog electrical signals communicated via a single data stream 80. For example, the transceiver integrated circuit 74 may additionally include a second transceiver amplifier unit 82 implemented to amplify a second frequency (e.g., 39 GHz, 37-43.5 GHz, 60 GHz, or 54-71 GHz) component in the first data stream 80A and a D−1th transceiver amplifier unit 82 implemented to amplify the second frequency component in the Dth data stream 80D.

To facilitate concurrently communicating with multiple antenna integrated circuits 78, as in the depicted example, the driver integrated circuit 76 may include multiple intermediate (e.g., driver) amplifier units 84. In some embodiments, each intermediate amplifier unit 84 may be dedicated to amplifying analog electrical signals communicated with a corresponding antenna integrated circuit 78. For example, the driver integrated circuit 76 may include a first intermediate amplifier unit 84A implemented to amplify analog electrical signal communicated with the first antenna integrated circuit 78A and an Mth intermediate amplifier unit 84M implemented to amplify analog electrical signal communicated with the Mth antenna integrated circuit 78M.

Similar to the transceiver amplifier units 82, in some embodiments, each intermediate amplifier unit 84 may be dedicated to amplifying analog electrical signals communicated via a corresponding data stream 80. For example, the first intermediate amplifier unit 84A may be implemented to amplify analog electrical signals in the first data stream 80A communicated with the first antenna integrated circuit 78A and the Mth intermediate amplifier unit 84M may be implemented to amplify analog electrical signals in the Dth first data stream 80D communicated with the Mth antenna integrated circuit 78M. As described above, in some embodiments, a data stream 80 may be supplied to multiple antenna integrated circuits 78, for example, to facilitate improving wireless (e.g., cell) coverage and/or implementing beam forming techniques. Thus, in some embodiments, multiple intermediate amplifier units 84 may be dedicated to amplifying analog electrical signals communicated with a single antenna integrated circuit 78. For example, the driver integrated circuit 76 may include a second intermediate amplifier unit 84 implemented to amplify analog electrical signals in the Dth first data stream 80D communicated with the first antenna integrated circuit 78A and a M−1th intermediate amplifier unit 84 implemented to amplify analog electrical signals in the first data stream 80A communicated with the Mth antenna integrated circuit 78M.

Moreover, similar to the transceiver amplifier units 82, in some embodiments, each intermediate amplifier unit 84 may be implemented may be dedicated to amplifying a corresponding frequency component. In other words, continuing with the above example, the first intermediate amplifier unit 84A may be implemented to amplify the first frequency (e.g., 28 GHz or 24.25-29.5 GHz) component in the first data stream 80A communicated with the first antenna integrated circuit 78A and the second intermediate amplifier unit 84 may be implemented to amplify the first frequency component in the Dth data stream 80D communicated with the first antenna integrated circuit 78A. Additionally, the Mth intermediate amplifier unit 84M may be implemented to amplify the first frequency component in the Dth data stream 80D communicated with the Mth antenna integrated circuit 78M and the M−1th intermediate amplifier unit 84 may be implemented to amplify the first frequency component in the first data stream 80A communicated with the Mth antenna integrated circuit 78M.

As described above, in some embodiments, a data stream 80 may be communicated via multiple different frequency bands (e.g., components, ranges, or spectrums). Thus, in some embodiments, multiple intermediate amplifier units 84 may be dedicated to amplifying analog electrical signals communicated via a single data stream 80. For example, the driver integrated circuit 76 may additionally include a third intermediate amplifier unit 84 implemented to amplify the second frequency (e.g., 39 GHz, 37-43.5 GHz, 60 GHz, or 54-71 GHz) component in analog electrical signals in the first data stream 80A communicated with the first antenna integrated circuit 78A and a fourth intermediate amplifier unit 84 implemented to amplify the second frequency component in analog electrical signals in the Dth data stream 80D communicated with the first antenna integrated circuit

78A. The driver integrated circuit 76 may also include a M−2th intermediate amplifier unit 84 implemented to amplify the second frequency component in analog electrical signals in the Dth data stream 80D communicated with the Mth antenna integrated circuit 78M and a M−3th intermediate amplifier unit 84 implemented to amplify the second frequency component in analog electrical signals in the first data stream 80A communicated with the Mth antenna integrated circuit 78M.

As described above, in some embodiments, routing circuitry 50 implemented in front-end circuitry 32 of a radio frequency system 12 may facilitate routing analog electrical signals to appropriate destinations. As in the depicted example, the routing circuitry 50 may be distributed across multiple integrated circuits. For example, intermediate (e.g., driver) routing circuitry 86 may be implemented in the driver integrated circuit 76 and antenna routing circuitry 88 may be implemented in the antenna integrated circuits 78. In some embodiments, the intermediate routing circuitry 86 may filter an input analog electrical signal (e.g., received from transceiver integrated circuit 74 and/or an antenna integrated circuit 78) to attenuate noise and/or to separate the input analog electrical signals into frequency components. Additionally, the intermediate routing circuitry 86 may route frequency components to appropriate intermediate amplifier units 84 and/or route amplified frequency components output from the intermediate amplifier units 84 to appropriate destinations (e.g., input pin of the transceiver integrated circuit 74 and/or an antenna integrated circuit 78).

In some embodiments, the routing circuitry 50 may be implemented at least in part in the transceiver integrated circuit 74. However, as will be described in more detail below, in other embodiments, at least a portion of transceiver routing circuitry 89 may be obviated (e.g., optional) by the intermediate routing circuitry 86, for example, due to the transceiver routing circuitry 89 combining multiple frequency components into a single analog electrical signal and the intermediate routing circuitry 86 subsequently separating the analog electrical signal back into the frequency components. In other words, in such embodiments, the transceiver integrated circuit 74 may be implemented without or with reduced transceiver routing circuitry 89, which, at least in some instances, may be facilitate reducing implementation associated cost of the front-end circuitry 32A and, thus, a radio frequency system 12 in which the front-end circuitry is implemented.

As in the depicted example, an antenna integrated circuit 78 may include multiple antennas 34. For example, the first antenna integrated circuit 78A includes a first antenna 34A and an Nth antenna 34N. In some embodiments, each antenna integrated circuit 78 may include four antennas 34. In other words, in such embodiments, the first antenna integrated circuit 78A may additionally include a second antenna 34 and a third antenna 34. Nevertheless, it should be appreciated that the depicted example is merely intended to be illustrative and not limiting. For example, in other embodiments, an antenna integrated circuit 78 may include a single antenna 34, two antennas 34, three antennas, or more than four antennas 34.

As described above, in some embodiments, a radio frequency system 12 may include multiple antennas 34 to facilitate communicating using multiple different frequency bands. For example, the first antenna 34A may be implemented to communicate via a first frequency (e.g., 28 GHz or 24.25-29.5 GHz) band and the Nth antenna 34N may be implemented to communicate via a second frequency (e.g., 39 GHz or 37-43.5 GHz) band. Additionally or alternatively, multiple antennas 34 may be implemented to communicate using the same frequency band, for example, to facilitate implementing beam forming techniques. In other words, continuing with the above example, a second antenna 34 implemented on the first antenna integrated circuit 78A may also be implemented to communicate via the second frequency and a third antenna 34 implemented on the first antenna integrated circuit 78A may be implemented to communicate via the first frequency.

As described above, phase shift circuitry 52 may facilitate implementing beam forming techniques, for example, by generating and/or supplying phase shifted versions of an analog electrical signal to multiple antennas 34 such that additive and/or destructive interference in resulting electromagnetic waves produces a beam (e.g., concentrated strength) oriented in a target direction (e.g., cell tower or access point). In other words, continuing with the above example, a first version of a first (e.g., 28 GHz or 24.25-29.5 GHz) analog electrical signal may be supplied to the first antenna 34A and a second version of the first analog electrical signal, which is phase shifted relative to the first version, may be supplied to the third antenna 34. Additionally or alternatively, a first version of a second (e.g., 39 GHz or 37-43.5 GHz) analog electrical signal may be supplied to the second antenna 34 and a second version of the second analog electrical signal, which is phase shifted relative to the first version, may be supplied to the Nth (e.g., fourth) antenna 34N.

It should be appreciated that the depicted example is merely intended to be illustrative and not limiting. For example, as described above, in other embodiments, the phase shift circuitry 52 may be obviated. Moreover, in other embodiments, phase shift circuitry 52 may additionally or alternatively be implemented at least in part in the driver integrated circuit 76, the transceiver integrated circuit 74, the digital processing circuitry 30, or any combination thereof.

In some embodiments, an antenna 34 may be implemented to enable multiple data streams 80 to be concurrently (e.g., simultaneously) communicated therethrough, for example, by polarizing corresponding electromagnetic waves. As an illustrative example, the first antenna 34A may be implemented to communicate the first data stream 80A via horizontally polarized electromagnetic waves and the Dth (e.g., second) data stream 80D via vertically polarized electromagnetic waves. Additionally or alternatively, the Nth antenna 34N may be implemented to communicate the first data stream 80A via horizontally polarized electromagnetic waves and the Dth (e.g., second) data stream 80D via vertically polarized electromagnetic waves.

To facilitate concurrently communicating via multiple antennas 34, as in the depicted example, an antenna integrated circuit 78 may include multiple antenna amplifier units 90. In some embodiments, each antenna amplifier unit 90 may be dedicated to amplifying analog electrical signals communicated via a corresponding antenna 34. For example, the first antenna integrated circuit 78A may include a first antenna amplifier unit 90A implemented to amplify analog electrical signals communicated via the first antenna 34A and an Nth antenna amplifier unit 90N implemented to amplify analog electrical signal communicated via the Nth antenna 34N.

Similar to the transceiver amplifier units 82 and/or the intermediate amplifier units 84, in some embodiments, each antenna amplifier unit 90 may be dedicated to amplifying analog electrical signals communicated via a corresponding data stream 80. For example, the first antenna amplifier unit 90A may be implemented to amplify analog electrical signals in the first data stream 80A communicated with the first antenna 34A and the Nth antenna amplifier unit 90N may be implemented to amplify analog electrical signals in the Dth data stream 80D communicated with the Nth antenna 34N. To facilitate concurrently communicating the Dth data stream 80D via the first antenna 34A, the first antenna integrated circuit 78A may additionally include a second antenna amplifier unit 90 implemented to amplify analog electrical signals in the Dth data stream 80D communicated with the first antenna 34A. Additionally or alternatively, to facilitate concurrently communicating the first data stream 80A via the Nth antenna 34N, the first antenna integrated circuit 78A may include an N−1th antenna amplifier unit 90 implemented to amplify analog electrical signals in the first data stream 80A communicated with the Nth antenna 34N.

Moreover, similar to the transceiver amplifier units 82 and/or the intermediate amplifier units 84, in some embodiments, each antenna amplifier unit 90 may be dedicated to amplifying a corresponding frequency component. For example, the first antenna amplifier unit 90A may be implemented to amplify the first frequency (e.g., 28 GHz or 24.25-29.5 GHz) component in the first data stream 80A communicated with the first antenna 34A and the Nth antenna amplifier unit 90N may be implemented to amplify the second frequency (e.g., 39 GHz or 37-43.5 GHz) component in the Dth data stream 80D. To facilitate concurrently communicating the Dth data stream 80D via the first antenna 34A, continuing with the above example, the second antenna amplifier unit 90 may be implemented to amplify the first frequency component in the Dth data stream 80D communicated with the first antenna 34A. Additionally or alternatively, to facilitate concurrently communicating the first data stream 80A via the Nth antenna 34N, the N−1th antenna amplifier unit 90 may be implemented to amplify the second frequency component in the first data stream 80A communicated with the Nth antenna 34N.

As described above, at least in some instances, the transceiver integrated circuit 74 and one or more antenna integrated circuits 78 may be separated by some distance, for example, when multiple antenna integrated circuits 78 are implemented at disparate locations in the electronic device 10. Thus, as in the depicted example, the driver integrated circuit 76 and one or more electrical connectors 92 may be coupled between the transceiver integrated circuit 74 and each antenna integrated circuit 78. In particular, a first end of an electrical connector 92 may be coupled to the driver integrated circuit 76 and a second (e.g., opposite) end of the electrical connector 92 may be coupled to an antenna integrated circuit 78. In other words, the driver integrated circuit 76 may be coupled on a transceiver-side of the electrical connector 92.

In this manner, as described above, a transceiver integrated circuit 74 and an antenna integrated circuits 78 may communicate analog electrical signals (e.g., indicating data to be wirelessly transmitted and/or wirelessly received data) therebetween. Additionally or alternatively, in some embodiments, a direct current (DC) electrical signal, a control (e.g., digital electrical) signal, or both may be communicated via an electrical connector 92, for example, from the controller 36 to an antenna integrated circuit 78. Furthermore, in some embodiments, an electrical connector 92 may be formed from electrically conductive material and, thus, may include a wire, a cable, a conductive trace, and/or the like.

It should be appreciated that the depicted example is merely intended to be illustrative and not limiting. For example, in other embodiments, a driver integrated circuit 76 may additionally or alternatively be coupled an antenna-side of the electrical connectors 92. Additionally or alternatively, one or more electrical connectors 92 may be coupled between the transceiver integrated circuit 74 and the driver integrated circuit 76, for example, when the transceiver integrated circuit 74 and the driver integrated circuit 76 are separated by some distance in the electronic device 10.

However, as described above, electromagnetic waves incident on electrically conductive material generally induces electrical current in the electrically conductive material. In other words, electromagnetic waves (e.g., interference) incident on an electrical connector 92 and/or electrically conductive material in an integrated circuit (e.g., transceiver integrated circuit 74, driver integrated circuit 76, or antenna integrated circuit 78) of the front-end circuitry 32A may induce electrical current therein, which, at least in some instances, may introduce noise in a concurrently communicated electrical signal, for example, by distorting the electrical signal. Accordingly, in some embodiments, electromagnetic shielding may be disposed in the transceiver integrated circuit 74, the driver integrated circuit 76, and/or an antenna integrated circuit 78. For example, electromagnetic shielding may be implemented on a housing of the driver integrated circuit 76, which is distinct from a housing of the transceiver integrated circuit 74. Additionally or alternatively, electromagnetic shielding disposed around (e.g., about) one or more of the electrical connectors 92.

Moreover, as described above, an electrical connector 92 generally produce some amount of loss when an electrical signal is communicated therethrough, for example, due to its inherent impedance (e.g., resistance, capacitance, and/or inductance). Thus, in some embodiments, the driver integrated circuit 76 may be implemented in close proximity to the transceiver integrated circuit 74, for example, to obviate and/or reduce length of electrical connectors 92 coupled therebetween. Moreover, in some embodiments, the driver integrated circuit 76 may be implemented such that a low (e.g., less than fifty ohms) and/or a complex impedance is present at its input and/or output ports (e.g., pins). At least in some instances, this may facilitate reducing loss resulting in communication between the transceiver integrated circuit 74 and the driver integrated circuit 76, for example, due to impedance and, thus, loss produce by an electrical connector 92 varying with length of the electrical connector 92.

Additionally, in some embodiments, an electrical connector 92 may be dedicated to communicating a specific data stream 80 with a specific antenna integrated circuit 78. For example, a first electrical connector 92A coupled between the driver integrated circuit 76 and the first antenna integrated circuit 78A may be implemented to communicate the first data stream 80A and a Dth electrical connector 92D coupled between the driver integrated circuit 76 and the first antenna integrated circuit may be implemented to communicate the Dth data stream 80D. Additionally, a D+1th electrical connector 92E coupled between the driver integrated circuit 76 and the Mth antenna integrated circuit 78M may be implemented to communicate the first data stream 80A and a 2Dth electrical connector 92H coupled between the driver integrated circuit 76 and the Mth antenna integrated circuit 78M may be implemented to communicate the Dth data stream 80D.

As described above, in some embodiments, a radio frequency system 12 may be implemented to enable concurrently (e.g., simultaneously) communicating multiple (e.g., two or more) data streams 80. Additionally, as described above, in some embodiments, a radio frequency system 12 may include multiple (e.g., two or more) antenna integrated circuits 78. To facilitate streamlining discussion, examples of the techniques are described with regard to embodiments implemented to concurrently communicate two data streams 80 via two antenna integrated circuits 78. However, it should be appreciated that the techniques described in the present disclosure may be applied to radio frequency systems 12 implemented to communicate a single data stream 80 or more than two data streams 80. Additionally, it should be appreciated that the techniques described in the present disclosure may be applied to radio frequency systems 12 implemented with a single antenna integrated circuit 78 or more than two antenna integrated circuits 78.

Figure 8:
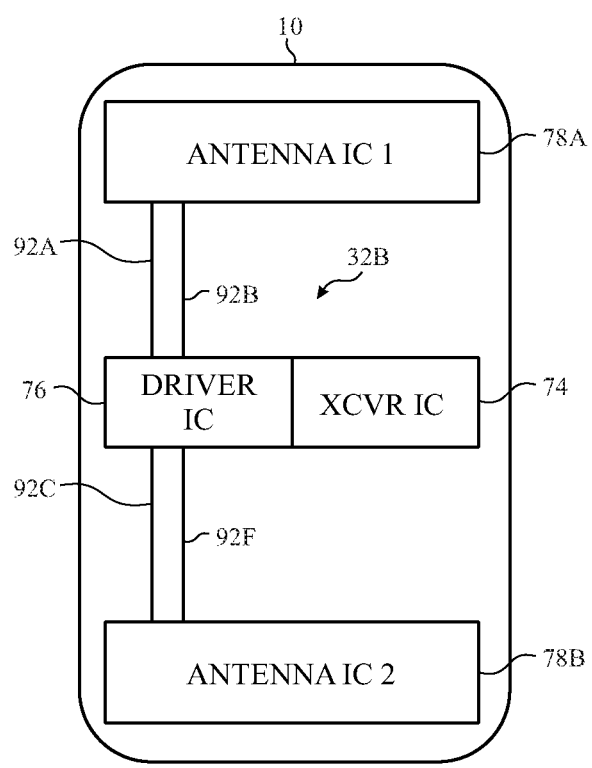
FIG. 8 is a schematic diagram of the transceiver integrated circuit, the driver integrated circuit, and two antenna integrated circuits of FIG. 7 implemented in an electronic device, in accordance with an embodiment of the present disclosure.

An example of front-end circuitry 32B implemented in an electronic device 10 to enable concurrently communicate two data streams 80—namely a first data stream 80A and a second data stream 80—via two antenna integrated circuits 78—namely a first antenna integrated circuit 78A and a second antenna integrated circuit 78B—is shown in FIG. 8. To facilitate improving wireless coverage, as in the depicted example, the first antenna integrated circuit 78A may be implemented at a first (e.g., top) end of the electronic device 10 while the second antenna integrated circuit 78B is implemented at a second (e.g., opposite or bottom) end of the electronic device 10.

To facilitate communicating two data streams 80 via the first antenna integrated circuit 78A, as in the depicted example, the driver integrated circuit 76 may be coupled to the first antenna integrated circuit 78A via two electrical connectors 92—namely a first electrical connector 92A and a second electrical connector 92B. In some embodiments, the first electrical connector 92A may be implemented to communicate the first data stream 80A and the second electrical connector 92B may be implemented to communicate the second data stream 80. Additionally, to facilitate communicating two data streams 80 via the second antenna integrated circuit 78B, as in the depicted example, the driver integrated circuit 76 may be coupled to the second antenna integrated circuit 78B via two electrical connectors— namely a third electrical connector 92C and a fourth electrical connector 92F. In some embodiments, the third electrical connector 92C may be implemented to communicate the first data stream 80A and the fourth electrical connector 92F may be implemented to communicate the second data stream 80.

Since connector loss generally varies with length of an electrical connector 92, as in the depicted example, the driver integrated circuit 76 may be implemented at a more central location in the electronic device 10. For example, the driver integrated circuit 76 may be positioned such that length of the first electrical connector 92A and length of the third electrical connector 92C are substantially (e.g., approximately) the same and/or length of the second electrical connector 92B and length of the fourth electrical connector 92F are substantially the same. In other words, in some embodiments, the driver integrated circuit 76 may be implemented approximately halfway between the first antenna integrated circuit 78A and the second antenna integrated circuit 78B.

Additionally, since connector loss generally varies with length of an electrical connector 92, as in the depicted example, the transceiver integrated circuit 74 may be implemented in close proximity to the driver integrated circuit 76. In other words, in some embodiments, the driver integrated circuit 76 may be directly coupled to the transceiver integrated circuit 74, thereby obviating electrical connectors 92 therebetween. Additionally or alternatively, length of an electrical connector 92 coupled between the driver integrated circuit 76 and the transceiver integrated circuit 74 may be substantially (e.g., significantly) shorter than an electrical connector 92 coupled between the driver integrated circuit 76 and an antenna integrated circuit 78. By implementing the driver integrated circuit 76 and the transceiver integrated circuit 74 in this manner, connector loss resulting in communication between the transceiver integrated circuit 74 and the driver integrated circuit 76 may be substantially (e.g., one or more orders of magnitude) less than the connector loss resulting in communication between the driver integrated circuit 76 and an antenna integrated circuit 78.

Moreover, as described above, in some embodiments, a data stream 80 may be communicated via multiple different frequency bands (e.g., components, ranges, or spectrums). For example, the first data stream 80A may be communicated using a first frequency band (e.g., 28 GHz or 24.25-29.5 GHz) and a second frequency (e.g., different, 39 GHz, or 37-43.5 GHz) band. Additionally or alternatively, the second data stream 80 may be communicated using the first frequency band and the second frequency band. Furthermore, in some embodiments, the first data stream 80A and/or the second data stream 80 may be communicated using a third frequency (e.g., 60 GHz or 54-71 GHz) band.

Figure 9:
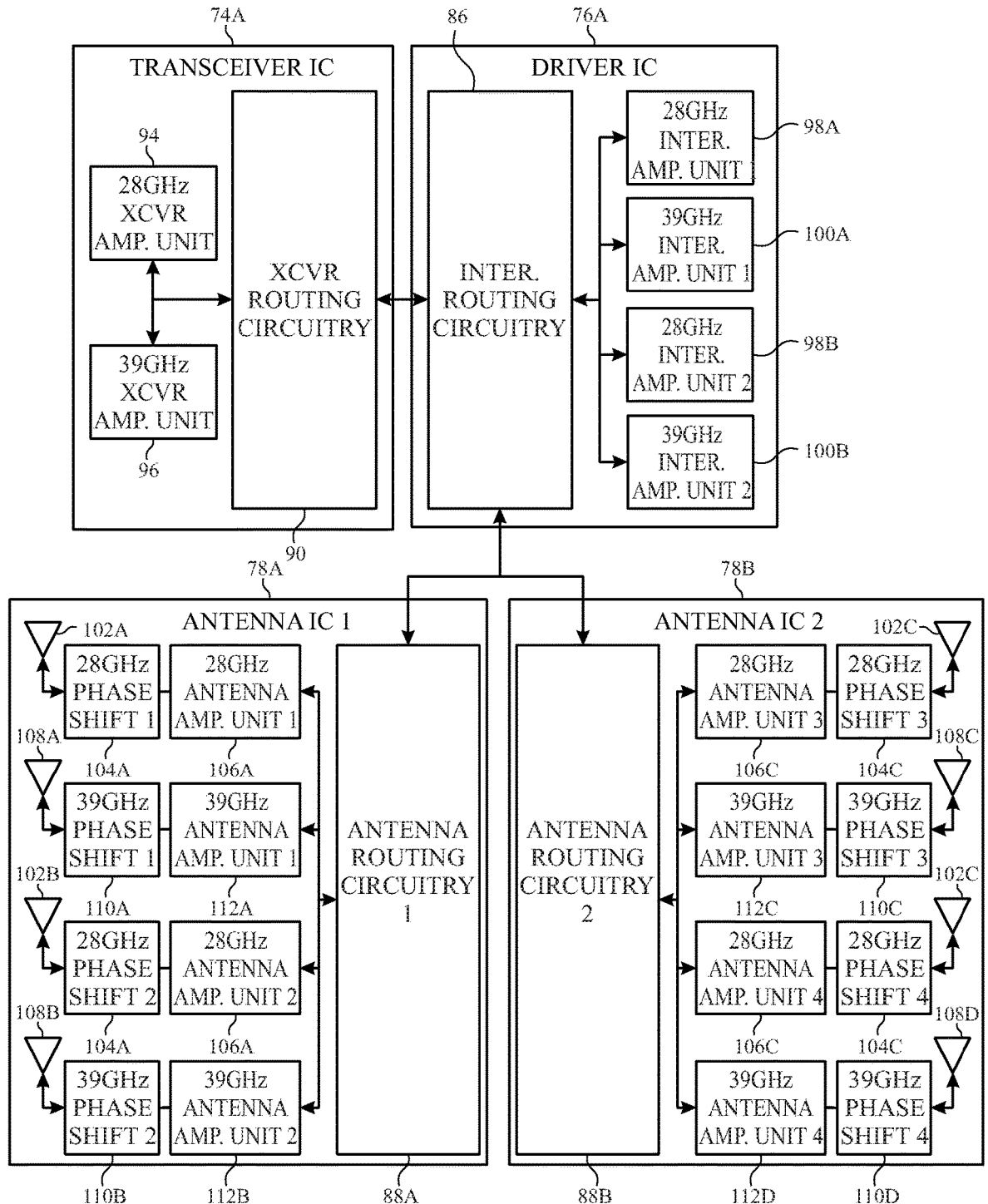
FIG. 9 is block diagram of an example of the transceiver integrated circuit, the driver integrated circuit, and the two antenna integrated circuits of FIG. 8, in accordance with an embodiment of the present disclosure.
Figure 10:
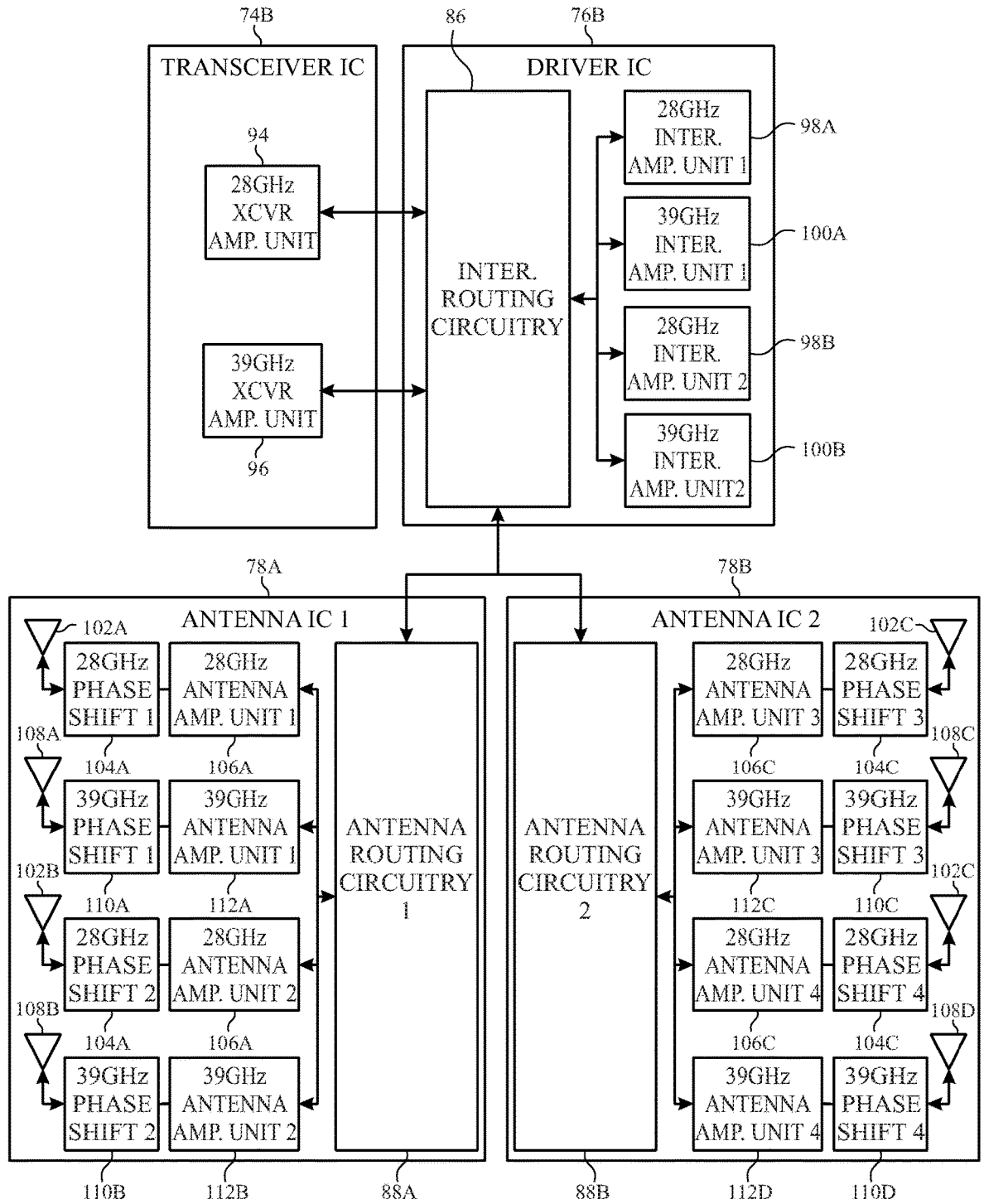
FIG. 10 is block diagram of another example of the transceiver integrated circuit, the driver integrated circuit, and the two antenna integrated circuits of FIG. 8, in accordance with an embodiment of the present disclosure.
Figure 11:
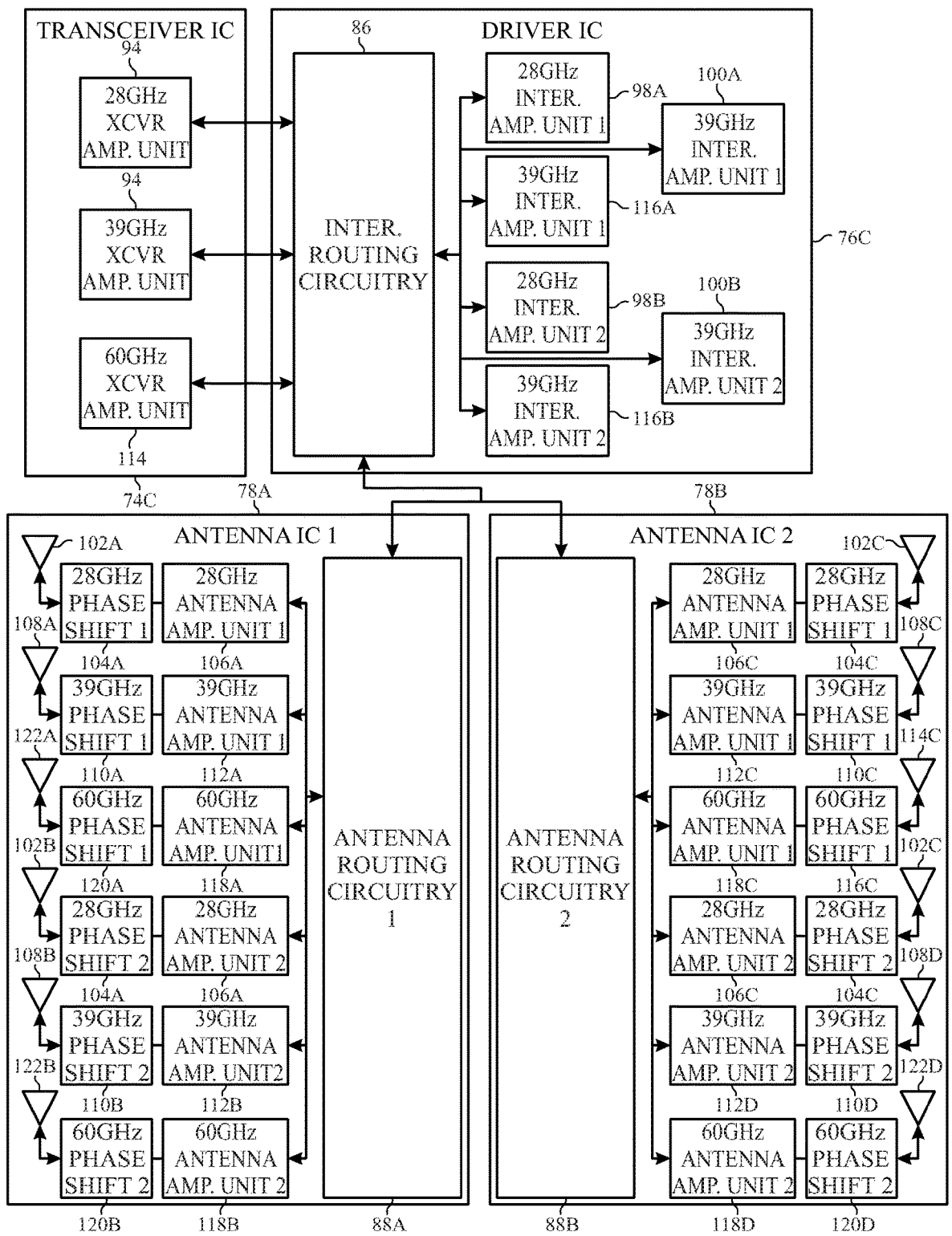
FIG. 11 is block diagram of another example of the transceiver integrated circuit, the driver integrated circuit, and the two antenna integrated circuits of FIG. 8, in accordance with an embodiment of the present disclosure.

To facilitate streamlining discussion, examples of front-end circuitry 32B relative to a single data stream 80 are described below with reference to FIGS. 9-11. In particular, FIG. 9 shows an example of a transceiver integrated circuit 74A, a driver integrated circuit 76A, the first antenna integrated circuit 78A, and the second antenna integrated circuit 78B implemented to communicate a data stream 80 including two frequency components—namely a 28 GHz (e.g., 24.25-29.5 GHz) component and a 39 GHz (e.g., 37-43.5 GHz) component. Additionally, FIG. 10 shows another example of a transceiver integrated circuit 74B, a driver integrated circuit 76B, the first antenna integrated circuit 78A, and the second antenna integrated circuit 78B implemented to communicate a data stream 80 including two frequency components. Furthermore, FIG. 11 shows an example a transceiver integrated circuit 74C, a driver integrated circuit 76C, the first antenna integrated circuit 78A, and the second antenna integrated circuit 78B implemented to communicate a data stream 80 including three frequency components—namely a 28 GHz component (e.g., 24.25-29.5 GHz), a 39 GHz (e.g., 37-43.5 GHz) component, and a 60 GHz (e.g., 54-71 GHz) component. It should be appreciated that the described examples are merely intended to be illustrative and not limiting. In particular, it should be appreciated that the techniques described herein may be applied on each of multiple data streams 80.

As indicated above, an example of front-end circuitry 32, which includes a transceiver integrated circuit 74A and a driver integrated circuit 76A implemented to communicate a data stream 80 including a 28 GHz (e.g., 24.25-29.5 GHz) component and a 39 GHz (e.g., 37-43.5 GHz) component, is shown in FIG. 9. To facilitate communicating the two frequency components, the transceiver integrated circuit 74A includes two transceiver amplifier units 82—namely a 28 GHz transceiver amplifier unit 94 and a 39 GHz transceiver amplifier unit 96. In other words, the 28 GHz transceiver amplifier unit 94 may be implemented to amplify a 28 GHz (e.g., 24.25-29.5 GHz) component of the data stream 80 and the 39 GHz transceiver amplifier unit may be implemented to amplify a 39 GHz (e.g., 37-43.5 GHz) component of the data stream 80.

Additionally, to facilitate communicating the two frequency components to both the first antenna integrated circuit 78A and the second antenna integrated circuit 78B, the driver integrated circuit 76A includes two sets of intermediate amplifier units 84—namely a set pair including a first 28 GHz intermediate amplifier unit 98A and a first 39 GHz intermediate amplifier unit 100A and a second set including a second 28 GHz intermediate amplifier unit 98B and a second 39 GHz intermediate amplifier unit 100B. In some embodiments, the first set of intermediate amplifier units 84 may be implemented to amplify analog electrical signals communicated with the first antenna integrated circuit 78A. Additionally or alternatively, the second set of intermediate amplifier units 84 may be implemented to amplify analog electrical signals communicated with the second antenna integrated circuit 78B.

Moreover, to facilitate implementing beam forming techniques using the two frequency components, each antenna integrated circuit 78 may include multiple antennas 34 and, thus, multiple antenna amplifier units 90 corresponding with each frequency component. For example, the first antenna integrated circuit 78A includes a first 28 GHz antenna 102A, first 28 GHz phase shift circuitry 104A, and a first 28 GHz antenna amplifier unit 106A in addition to a second 28 GHz antenna 102B, second 28 GHz phase shift circuitry 104B, and a second 28 GHz antenna amplifier unit 106B. Similarly, the second antenna integrated circuit 78B includes a third 28 GHz antenna 102C, third 28 GHz phase shift circuitry 104C, and a third 28 GHz antenna amplifier unit 106C in addition to a fourth 28 GHz antenna 102D, fourth 28 GHz phase shift circuitry 104D, and a fourth 28 GHz antenna amplifier unit 106D.

In some embodiments, the 28 GHz antenna amplifier units 106 may amplify a first version of the 28 GHz component (e.g., 24.25-29.5 GHz) to be supplied to the first 28 GHz antenna 102A, a second version of the 28 GHz component to be supplied to the second 28 GHz antenna 102B, a third version of the 28 GHz component to be supplied to the third 28 GHz antenna 102C, and a fourth version of the 28 GHz component to be supplied to the fourth 28 GHz antenna 102D. Additionally, in some embodiments, the 28 GHz phase shift circuitry 104 may phase shift the 28 GHz component such that one or more of the first version, the second version, the third version, and the fourth version of the 28 GHz component are phase shifted (e.g., time delayed) relative to one another. Furthermore, in some embodiments, the amount of phase shift may be adaptively (e.g., dynamically) adjusted, for example, such that resulting constructive and/or destructive interface produces a 28 GHz beam in a target direction (e.g., toward a cell tower or access point).

Additionally, as depicted, the first antenna integrated circuit 78A includes a first 39 GHz antenna 108A, first 39 GHz phase shift circuitry 110A, and a first 39 GHz antenna amplifier unit 112A in addition to a second 39 GHz antenna 108B, second 39 GHz phase shift circuitry 110B, and a second 39 GHz antenna amplifier unit 112B. Similarly, the second antenna integrated circuit 78B includes a third 39 GHz antenna 108C, third 39 GHz phase shift circuitry 110C, and a third 39 GHz antenna amplifier unit 112C in addition to a fourth 39 GHz antenna 108D, fourth 39 GHz phase shift circuitry 110D, and a fourth 39 GHz antenna amplifier unit 112D.

In some embodiments, the 39 GHz antenna amplifier units 112 may amplify a first version of the 39 GHz (e.g., 37-43.5 GHz) component to be supplied to the first 39 GHz antenna 108A, a second version of the 39 GHz component to be supplied to the second 39 GHz antenna 108B, a third version of the 39 GHz component to be supplied to the third 39 GHz antenna 108C, and a fourth version of the 39 GHz component to be supplied to the fourth 39 GHz antenna 108D. Additionally, in some embodiments, the 39 GHz phase shift circuitry 110 may phase shift the 39 GHz component such that one or more of the first version, the second version, the third version, and the fourth version are 39 GHz component phase shifted (e.g., time delayed) relative to one another. Furthermore, in some embodiments, the amount of phase shift may be adaptively (e.g., dynamically) adjusted, for example, such that resulting constructive and/or destructive interface produces a 39 GHz beam in a target direction (e.g., toward a cell tower or access point).

As described above, routing circuitry 50 may be implemented to facilitate routing analog electrical signals to one or more appropriate destinations. As an illustrative example, during reception, first antenna routing circuitry 88A implemented in the first antenna integrated circuit 78A may combine 28 GHz (e.g., 24.25-29.5 GHz) components output from the first 28 GHz antenna amplifier unit 106A and the second 28 GHz antenna amplifier unit 106B with 39 GHz (e.g., 37-43.5 GHz) components output from the first 39 GHz antenna amplifier unit 112A and the second 39 GHz antenna amplifier unit 112B into a first analog electrical signal, which may then be output to the driver integrated circuit 76A (e.g., via the first electrical connector 92A). Similarly, during reception, second antenna routing circuitry 88B implemented in the second antenna integrated circuit 78B may combine 28 GHz components output from the third 28 GHz antenna amplifier unit 106C and the fourth 28 GHz antenna amplifier unit 106D with 39 GHz components output from the third 39 GHz antenna amplifier unit 112C and the fourth 39 GHz antenna amplifier unit 112D into a second analog electrical signal, which may then be output to the driver integrated circuit 76A (e.g., via the third electrical connector 92C).

Continuing with the above example, during reception, intermediate routing circuitry 86 implemented in the driver integrated circuit 76A may separate the first analog electrical signal received from the first antenna integrated circuit 78A into a 28 GHz (e.g., 24.25-29.5 GHz) component, which is output (e.g., routed) to the first 28 GHz intermediate amplifier unit 98A, and a 39 GHz component (e.g., 37-43.5 GHz), which is output to the first 39 GHz intermediate amplifier unit 100A. During reception, the intermediate routing circuitry 86 may also separate the second analog electrical signal received from the second antenna integrated circuit 78B into a 28 GHz component, which is output (e.g., routed) to the second 28 GHz intermediate amplifier unit 98B, and a 39 GHz component, which is output to the second 39 GHz intermediate amplifier unit 100B. After amplification by the intermediate amplifier units 84, the intermediate routing circuitry 86 may combine the 28 GHz components output from the first 28 GHz intermediate amplifier unit 98A and the second 28 GHz intermediate amplifier unit 98B with the 39 GHz components output from the first 39 GHz intermediate amplifier unit 100A and the second 39 GHz intermediate amplifier unit 100B into a single analog electrical signal, which may then be output to the transceiver integrated circuit 74.

Continuing with the above example, during reception, transceiver routing circuitry 89 implemented in the transceiver integrated circuit 74A may separate the analog electrical signal received from the driver integrated circuit 76A into a 28 GHz (e.g., 24.25-29.5 GHz) component and a 39 GHz (e.g., 37-43.5 GHz) component. Additionally, the transceiver routing circuitry 89 may output (e.g., route) the 28

GHz component to the 28 GHz transceiver amplifier unit 94 and the 39 GHz component to the 39 GHz transceiver amplifier unit 96. After amplification by the transceiver amplifier units 82, the transceiver integrated circuit 74A may process the frequency components, for example, to down convert the communication frequency (e.g., 28 GHz or 39 GHz) to a processing (e.g., baseband) frequency via a frequency convert 46 and/or to convert the frequency components from analog electrical signal into digital electrical signals via the analog-to-digital converter 42.

Generally, front-end circuitry 32 may operate in reverse during transmission. In other words, since the intermediate routing circuitry 86 combines 28 GHz (e.g., 24.25-29.5 GHz) components and 39 GHz (e.g., 37-43.5 GHz) components into a single analog electrical signal and the transceiver routing circuitry 89 filters (e.g., separates) the analog electrical signal into a 28 GHz component and a 39 GHz component during reception, the transceiver routing circuitry 89 may combine a 28 GHz component and a 39 GHz component into a single analog electrical signal and the intermediate routing circuitry 86 may filter the analog electrical signal back into the 28 GHz component, which is then split between the 28 GHz intermediate amplifier units 98, and the 39 GHz component, which is then split between the 39 GHz intermediate amplifier units 100, during transmission. As such, in some embodiments, the transceiver routing circuitry 89 and at least a portion of the intermediate routing circuitry 86 (e.g., input filter 68 and/or combiner 72) may be obviated, which, at least in some instances may facilitate reducing implementation associated cost of front-end circuitry 32 and, thus, a radio frequency system 12 in which the front-end circuitry 32 is implemented.

To help illustrate, as indicated above, another example of front-end circuitry 32, which includes a transceiver integrated circuit 74B and a driver integrated circuit 76B implemented to communicate a data stream 80 including a 28 GHz (e.g., 24.25-29.5 GHz) component and a 39 GHz (e.g., 37-43.5 GHz) component, is shown in FIG. 10. The first antenna integrated circuit 78A and the second antenna integrated circuit 78B described with reference to FIG. 10 may generally be implemented and/or operate in the same or an analogous manner as described above with reference to FIG. 9. Additionally, the 28 GHz intermediate amplifier units 98 and the 39 GHz intermediate amplifier units 100 described with reference to FIG. 10 may generally be implemented and/or operate in the same or an analogous manner as described above with reference to FIG. 9.

However, as depicted in FIG. 10, the transceiver integrated circuit 74B is implemented such that its 28 GHz transceiver amplifier unit 94 and 39 GHz transceiver amplifier unit 96 communicate directly with intermediate routing circuitry 86 implemented in the driver integrated circuit 76B (e.g., obviating transceiver routing circuitry 89). In other words, the transceiver integrated circuit 74B may communicate multiple analog electrical signals with the driver integrated circuit 76B (e.g., instead of a single analog electrical signal including multiple frequency components). For example, during transmission, the 28 GHz transceiver amplifier unit 94 may output a 28 GHz (e.g., 24.25-29.5 GHz) component to the intermediate routing circuitry 86 via a first analog electrical signal and the 39 GHz transceiver amplifier unit 96 may output a 39 GHz (e.g., 37-43.5 GHz) component to the intermediate routing circuitry 86 via a second analog electrical signal.

Continuing with the above example, during transmission, the intermediate routing circuitry 86 may split the first analog electrical signal to supply a first version of the 28 GHz (e.g., 24.25-29.5 GHz) component to the first 28 GHz intermediate amplifier unit 98A and a second version of the 28 GHz component to the second 28 GHz intermediate amplifier unit 98B. In an analogous manner, during transmission, the intermediate routing circuitry 86 may split the second analog electrical signal to supply a first version to of the 39 GHz (e.g., 37-43.5 GHz) component to the first 39 GHz intermediate amplifier unit 100A and a second version of the 39 GHz component to the second 39 GHz intermediate amplifier unit 100B. The intermediate routing circuitry 86 implemented in the driver integrated circuit 76B may generally operate in reverse during reception of a data stream 80 communicated using two communication frequency bands (e.g., 28 GHz and 39 GHz).

As indicated above, another example of front-end circuitry 32, which includes a transceiver integrated circuit 74C and a driver integrated circuit 76C implemented to communicate a data stream 80 including three frequencies components, is shown in FIG. 11. Generally, the example described with reference to FIG. 11 is implemented and/or operates in analogous manner as the example described above with reference to FIG. 10, but with 60 GHz components (e.g., amplifier units 48, antennas 34, and/or phase shift circuitry 52). For example, as depicted, the transceiver amplifier units 82 implemented in the transceiver integrated circuit 74C includes a 60 GHz transceiver amplifier unit 114 in addition to a 28 GHz transceiver amplifier unit 94 and a 39 GHz transceiver amplifier unit 96. In other words, the 60 GHz transceiver amplifier unit 114 may be implemented to amplify a 60 GHz (e.g., 54-71 GHz) component of the data stream 80.

Additionally, as depicted, intermediate amplifier units 84 implemented in the driver integrated circuit 76C include 60 GHz intermediate amplifier units 116 in addition to the 28 GHz intermediate amplifier units 98 and the 39 GHz intermediate amplifier units 100. In particular, to facilitate communicating the three frequency components to both the first antenna integrated circuit 78A and the second antenna integrated circuit 78B, the driver integrated circuit 76A includes two sets of intermediate amplifier units 84—namely a first set, which includes a first 28 GHz intermediate amplifier unit 98A, a first 39 GHz intermediate amplifier unit 100A, and a first 60 GHz intermediate amplifier unit 116A, and a second set, which includes a second 28 GHz intermediate amplifier unit 98B, a second 39 GHz intermediate amplifier unit 100B, and a second 60 GHz intermediate amplifier unit 116B. In some embodiments, the first set of intermediate amplifier units 84 may be implemented to amplify analog electrical signals communicated with the first antenna integrated circuit 78A and the second set of intermediate amplifier units 84 may be implemented to amplify analog electrical signals communicated with the second antenna integrated circuit 78B.

Thus, during transmission, intermediate routing circuitry 86 implemented in the driver integrated circuit 76B may split a 60 GHz (e.g., 54-71 GHz) component received from the 60 GHz transceiver amplifier unit 114 to supply a first version of the 60 GHz component to the first 60 GHz intermediate amplifier unit 116A and a second version of the 60 GHz component to the second 60 GHz intermediate amplifier unit 116B. After amplification by the intermediate amplifier units 84, the intermediate routing circuitry 86 may combine a 60 GHz component output from the first 60 GHz intermediate amplifier unit 116A, a 28 GHz (e.g., 24.25-29.5 GHz) component output from the first 28 GHz intermediate amplifier unit 98A, and a 39 GHz (e.g., 37-43.5 GHz) component output from the first 39 GHz intermediate amplifier unit 100A into a first analog electrical signal, which may then be output to the first antenna integrated circuit 78. In a similar or analogous manner, the intermediate routing circuitry 86 may generate and/or output a second analog electrical signal to the second antenna integrated circuit 78B during transmission.

Furthermore, as depicted, antenna amplifier units 90 implemented in the antenna integrated circuits 78 include 60 GHz antenna amplifier units in addition to 28 GHz antenna amplifier units 106 and 39 GHz antenna amplifier units 112. Moreover, antennas 34 implemented on the antenna integrated circuit 78 may include 60 GHz antennas 122 in addition to 28 GHz antennas 102 and 39 GHz antennas 108. Furthermore, in some embodiments, phase shift circuitry 52 implemented in the antenna integrated circuits 78 may include 60 GHz phase shift circuitry 120 in addition to 28 GHz phase shift circuitry 104 and 39 GHz phase shift circuitry 110. For example, as depicted, the first antenna integrated circuit 78A includes a first 60 GHz antenna 122A, first 60 GHz phase shift circuitry 120A, and a first 60 GHz antenna amplifier unit 118A in addition to a second 60 GHz antenna 122B, second 60 GHz phase shift circuitry 120B, and a second 60 GHz antenna amplifier unit 118B. Additionally, as depicted, the second antenna integrated circuit 78B includes a third 60 GHz antenna 122C, third 60 GHz phase shift circuitry 120C, and a third 60 GHz antenna amplifier unit 118C in addition to a fourth 60 GHz antenna 122D, fourth 60 GHz phase shift circuitry 120D, and a fourth 60 GHz antenna amplifier unit 118D.

Thus, during transmission, first antenna routing circuitry 88A implemented in the first antenna integrated circuit 78A may filter a first analog electrical signal received from the driver integrated circuit 76C into a 28 GHz (e.g., 24.25-29.5 GHz) component, a 39 GHz component (e.g., 37-43.5 GHz), and a 60 GHz (e.g., 54-71 GHz) component. As described above, the first antenna routing circuitry 88A may split the 28 GHz component to supply the 28 GHz component to multiple 28 GHz antenna amplifier units 106 and split the 39 GHz component to supply the 39 GHz component to multiple 39 GHz antenna amplifier units 112. In an analog manner, the first antenna routing circuitry 88A may split the 60 GHz component to supply a first version of the 60 GHz component to the first 60 GHz antenna amplifier unit 118A and a second version of the 60 GHz antenna amplifier unit 118B, for example, which may then be processed by the 60 GHz phase shift circuitry 120 such that the first version and the second version are phase-shifted relative to one another to facilitate forming a beam in a target direction.

As described above, the routing circuitry 50 may generally operate in reverse during reception. In other words, during reception, the first antenna routing circuitry 88A may combine the 28 GHz (e.g., 24.25-29.5 GHz) components output from the 28 GHz antenna amplifier units 106, the 39 GHz (e.g., 37-43.5 GHz) components output from the 39 GHz antenna amplifier units 112, and the 60 GHz (e.g., 54-71 GHz) components output from the 60 GHz antenna amplifier units 118 into a (e.g., first) analog electrical signal, which may then be output to the driver integrated circuit 76C. Second antenna routing circuitry 88B implemented in the second antenna integrated circuit 78B may operate in an analogous manner during transmission and/or reception.

Figure 12:
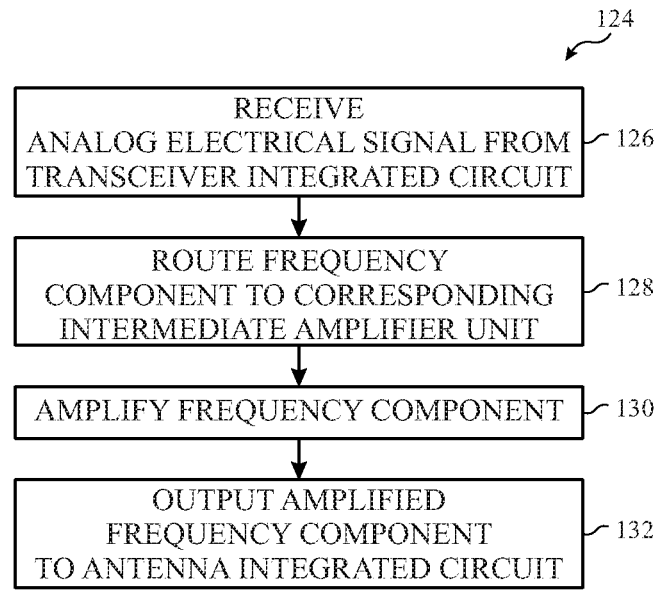
FIG. 12 is a flow diagram of an example process for operating the driver integrated circuit of FIG. 7 in a transmission mode, in accordance with an embodiment of the present disclosure.

To help further illustrate, an example of a process 124 for operating front-end circuitry 32, which includes a driver integrated circuit 76, during transmission is described in FIG. 12. Generally, the process 124 includes receiving an analog electrical signal from a transceiver integrated circuit (process block 126), routing a frequency component of the analog electrical signal to a corresponding intermediate amplifier unit (process block 128), amplifying the frequency component (process block 130), and outputting the amplified frequency component to an antenna integrated circuit (process block 132).

Although described in a particular order, which represents a particular embodiment, it should be noted that the process 124 may be performed in any suitable order. Additionally, embodiments of the process 124 may omit process blocks and/or include additional process blocks. Moreover, in some embodiments, the process 124 may be implemented at least in part by executing instructions stored in a tangible, non-transitory, computer-readable medium, such as controller memory 40, using processing circuitry, such as the controller processor 38.

As described above, a driver integrated circuit 76 implemented in front-end circuitry 32 of a radio frequency system 12 may receive an analog electrical signal from a transceiver integrated circuit 74 (process block 126). In some embodiments, a controller 36 may instruct the transceiver integrated circuit 74 to output an analog electrical signal by instructing the transceiver integrated circuit 74 to connect (e.g., close transmit amplifier switching device 60 and open receipt amplifier switching device 64) one or more transmit (e.g., power) amplifiers 58 implemented in its transceiver amplifier units 82. As described above, in some embodiments, different frequency components may be separately output from the transceiver integrated circuit 74 and, thus, separately received by the driver integrated circuit 76, for example, as separate analog electrical signals.

As described above, in other embodiments, the transceiver integrated circuit 74 may combine the different frequency components into a single analog electrical signal before output to the driver integrated circuit 76. Thus, in such embodiments, the driver integrated circuit 76 may filter the analog electrical signal back into the frequency components. In other words, the driver integrated circuit 76 may identify a frequency component by receiving the frequency component directly from the transceiver integrated circuit and/or by filtering (e.g., extracting) the frequency component from an analog electrical signal received from the transceiver integrated circuit 74.

After identifying a frequency component, the driver integrated circuit 76 may route the frequency component to one or more intermediate amplifier units implemented to amplify that frequency component (process block 128). For example, when the driver integrated circuit 76 includes multiple 28 GHz intermediate amplifier units 98, the driver integrated circuit 76 may split an analog electrical signal that includes the 28 GHz (e.g., 24.25-29.5 GHz) component such that the 28 GHz component is supplied (e.g., routed) to each of the 28 GHz intermediate amplifier units 98. Additionally or alternatively, when the driver integrated circuit 76 includes multiple 39 GHz intermediate amplifier units 100, the driver integrated circuit 76 may split an analog electrical signal that includes the 39 GHz (e.g., 37-43.5 GHz) component such that the 39 GHz component is supplied to each of the 28 GHz intermediate amplifier units 98.

As described above, front-end circuitry 32 including the driver integrated circuit 76 may amplify frequency components, for example, to facilitate controlling output power of resulting electromagnetic waves, overcoming propagation loss on the resulting electromagnetic waves, and/or overcoming connector loss resulting on analog electrical signals communicated via an electrical connector 92 (process block 130). To facilitate overcoming connector loss and/or propagation loss produced during transmission, the intermediate amplifier units 84 may amplify corresponding frequency components, for example, before multiple frequency components are combined and output to an antenna integrated circuit 78 as a single analog electrical signal. In some embodiments, the controller 36 may instruct an intermediate amplifier unit 84 to amplify a corresponding frequency component by instructing the driver integrated circuit 76 to connect the transmit amplifier 58 implemented in the intermediate amplifier unit 84, for example, by closing its transmit amplifier switching device 60 while maintaining its receipt amplifier switching device 64 open.

Additionally or alternatively, to facilitate overcoming propagation loss and/or controlling output power, antenna amplifier units 90 implemented in an antenna integrated circuit 78 may amplify corresponding frequency components after amplification by the intermediate amplifier units 84. For example, after amplification of a 28 GHz (e.g., 24.25-29.5 GHz) component by a 28 GHz intermediate amplifier unit 98, a first 28 GHz antenna amplifier unit 106A implemented in the antenna integrated circuit 78 may amplify a first version of the 28 GHz component and a second 28 GHz antenna amplifier unit 106B implemented in the antenna integrated circuit 78 may amplify a second version of the 28 GHz component. Additionally or alternatively, after amplification by of a 39 GHz (e.g., 37-43.5 GHz) component by a 39 GHz intermediate amplifier unit 100, a first 39 GHz antenna amplifier unit 112A implemented in the antenna integrated circuit 78 may amplify a first version of the 39 GHz component and a second 39 GHz antenna amplifier unit 112B implemented in the antenna integrated circuit 78 may amplify a second version of the 39 GHz component. In some embodiments, the controller 36 may instruct an antenna amplifier unit 90 to amplify a corresponding frequency component by instructing the antenna amplifier unit 90 to connect its transmit amplifier 58, for example, by closing its transmit amplifier switching device 60 while maintaining its receipt amplifier switching device 64 open and, thus, its receipt amplifier 58 disconnected.

After amplification by the intermediate amplifier units 84, amplified versions of the frequency components may be supplied to corresponding antennas 34, for example, implemented on one or more antenna integrated circuits 78 (process block 132). As described above, in some embodiments, phase shift circuitry 52 may be implemented in the front-end circuitry 32, for example, to facilitate implementing beam forming techniques. For example, 28 GHz phase shift circuitry 104 implemented in the antenna integrated circuit 78 may generate a first amplified version of the 28 GHz component to be supplied to a first 28 GHz antenna 102A and a second amplified version of the 28 GHz component to be supplied to a second 28 GHz antenna 102B such that the first amplified version and the second amplified version of the 28 GHz component are phase-shifted (e.g., time delayed) relative to one another. Additionally or alternatively, 39 GHz phase shift circuitry 110 implemented in the antenna integrated circuit 78 may generate a first amplified version of the 39 GHz component to be supplied to a first 39 GHz antenna 108A and a second amplified version of the 39 GHz component to be supplied to a second 39 GHz antenna 108B such that the first amplified version and the second amplified version of the 39 GHz component are phase-shifted (e.g., time delayed) relative to one another.

As described above, an antenna 34 may modulate electromagnetic waves based on an input analog electrical signal, thereby wirelessly transmitting data indicated by the input analog electrical signal. In other words, front-end circuitry 32 including a driver integrated circuit 76 may operate in this manner to facilitate wirelessly transmitting data from a radio frequency system 12 and, thus, an electronic device 10 in which the radio frequency system 12 is implemented. As described above, front-end circuitry 32 may be implemented in a radio frequency system 12 to facilitate reception of wirelessly transmitted data.

Figure 13:
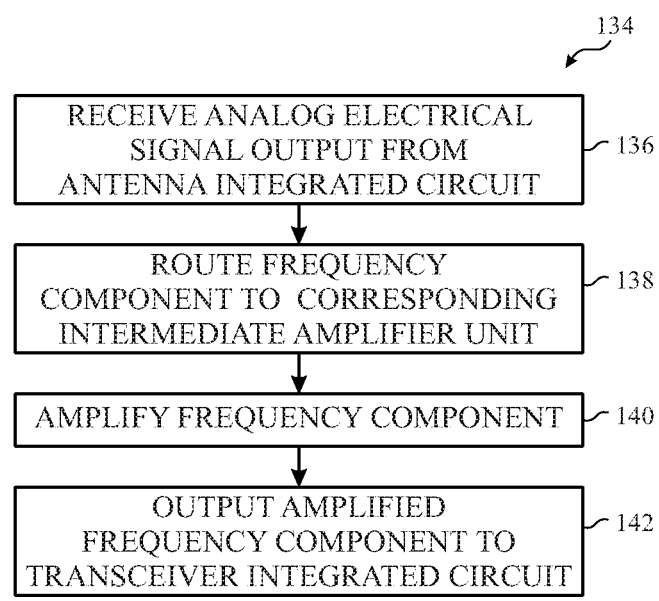
FIG. 13 is a flow diagram of an example process for operating the driver integrated circuit of FIG. 7 in a reception mode, in accordance with an embodiment of the present disclosure.

To help further illustrate, an example of a process 134 for operating front-end circuitry 32, which includes a driver integrated circuit 76, to facilitate wireless reception is described in FIG. 13. Generally, the process 134 includes receiving an analog electrical signal output from an antenna integrated circuit (process block 136), routing a frequency component of the analog electrical signal to a corresponding intermediate amplifier unit (process block 138), amplifying the frequency component (process block 140), and outputting the amplified frequency component to a transceiver integrated circuit (process block 142).

Although described in a particular order, which represents a particular embodiment, it should be noted that the process 134 may be performed in any suitable order. Additionally, embodiments of the process 134 may omit process blocks and/or include additional process blocks. Moreover, in some embodiments, the process 134 may be implemented at least in part by executing instructions stored in a tangible, non-transitory, computer-readable medium, such as controller memory 40, using processing circuitry, such as the controller processor 38.

As described above, front-end circuitry 32 implemented in a radio frequency system 12 may receive an analog electrical signal output from an antenna 34, for example, implemented on an antenna integrated circuit 78 based on electromagnetic waves incident on the antenna 34 (process block 136). As described above, in some embodiments, the analog electrical signal may be output to a portion of the front-end circuitry 32 (e.g., antenna amplifier units 90) implemented in an antenna integrated circuit 78 along with the antenna 34. To facilitate overcoming connector loss and/or propagation loss produced during reception, the antenna amplifier units 90 may amplify corresponding frequency components, for example, after phase-shifting and/or before multiple frequency components are combined and output to a driver integrated circuit 76 as a single analog electrical signal. In some embodiments, a controller 36 may instruct an antenna amplifier unit 90 to amplify a corresponding frequency component by instructing the antenna amplifier unit 90 to connect its receipt amplifier 62, for example, by closing its receipt amplifier switching device 64 while maintaining its transmit amplifier switching device 60 open and, thus, its transmit amplifier 58 disconnected.

From the analog electrical signal received from the antenna integrated circuit 78, the driver integrated circuit 76 may identify a frequency component and route the frequency component to a corresponding intermediate amplifier unit 84 (process block 138). In some embodiments, the driver integrated circuit 76 may identify a frequency component by filtering (e.g., extracting) the frequency component out from the analog electrical signal. For example, from a first analog electrical signal received from a first antenna integrated circuit 78A, the driver integrated circuit 76 may extract a first 28 GHz component that is routed to a first 28 GHz intermediate amplifier unit 98A and a first 39 GHz component that is routed to a first 39 GHz intermediate amplifier unit 100A. Additionally or alternatively, from a second analog electrical signal received from a second antenna integrated circuit 78B, the driver integrated circuit 76 may extract a second 28 GHz component that is routed to a second 28 GHz intermediate amplifier unit 98B and a second 39 GHz component that is routed to a second 39 GHz intermediate amplifier unit 100B.

To facilitate overcoming connector loss and/or propagation loss produced during reception, the driver integrated circuit 76 may amplify the frequency component, for example, before combination with another analog electrical signal and output to the transceiver integrated circuit 74 (process block 140). For example, the first 28 GHz intermediate amplifier unit 98A may amplify the first 28 GHz component and the first 39 GHz intermediate amplifier unit 100A may amplify the first 39 GHz component. Additionally or alternatively, the second 28 GHz intermediate amplifier unit 98B may amplify the second 28 GHz component and the second 39 GHz intermediate amplifier unit 100B may amplify the second 39 GHz component. In some embodiments, the controller 36 may instruct an intermediate amplifier unit 84 to amplify a corresponding frequency component by instructing the intermediate amplifier unit 84 to connect its receipt amplifier 62, for example, by closing its receipt amplifier switching device 64 while maintaining its transmit amplifier switching device 60 open and, thus, its transmit amplifier 58 disconnected.

After amplification by the intermediate amplifier units 84, the driver integrated circuit 76 may output amplified versions of the frequency components to a transceiver integrated circuit 74 (process block 142). In some embodiments, the driver integrated circuit 76 may combine multiple different frequencies corresponding with the same data stream 80 into a single analog electrical signal, which is output to the transceiver integrated circuit 74. For example, the driver integrated circuit 76 may combine an amplified version of the first 28 GHz component output from the first 28 GHz intermediate amplifier unit 98A and an amplified version of the first 39 GHz component output from the first 39 GHz intermediate amplifier unit 100A.

As described above, in other embodiments, the driver integrated circuit 76 may separately output different frequency components to the transceiver integrated circuit 74, for example, as separate analog electrical signals. For example, when first 28 GHz component and the second 28 GHz component are part of the same data stream 80, the driver integrated circuit 76 may combine an amplified version of the first 28 GHz component output from the first 28 GHz intermediate amplifier unit 98A with an amplified version of the second 28 GHz component output from the second 28 GHz intermediate amplifier unit 98B and output a combined 28 GHz (e.g., 24.25-29.5 GHz) analog electrical signal to the transceiver integrated circuit 74. Additionally or alternatively, when first 39 GHz component and the second 39 GHz component are part of the same data stream 80, the driver integrated circuit 76 may combine an amplified version of the first 39 GHz component output from the first 39 GHz intermediate amplifier unit 100A with an amplified version of the second 39 GHz component output from the second 39 GHz intermediate amplifier unit 100B and output a combined 39 GHz (e.g., 37-43.5 GHz) analog electrical signal to the transceiver integrated circuit 74.

As described above, the transceiver integrated circuit 74 process an analog electrical signal received from the driver integrated circuit 76 to enable further processing and/or analysis by the digital processing circuitry 30. For example, the transceiver integrated circuit 74 may convert the analog electrical signal to a processing (e.g., baseband) frequency expected by the digital processing circuitry 30. Additionally or alternatively, the transceiver integrated circuit 74 may convert the analog electrical signal into a digital electrical signal and, thus, from the analog domain to the digital domain. In other words, front-end circuitry 32 including a driver integrated circuit 76 implemented in a radio frequency system 12 may operate in this manner to facilitate receiving data wirelessly transmitted from another radio frequency system 12, a communication network, and/or another electronic device 10.

Figure 14:
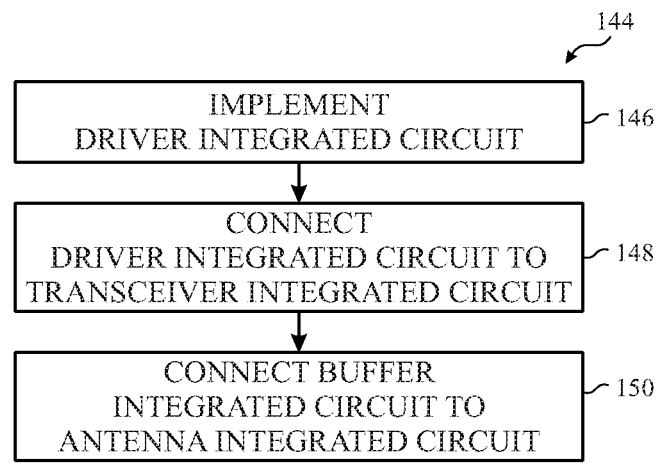
FIG. 14 is a flow diagram of an example process for implementing the portion of the radio frequency system of FIG. 7, in accordance with an embodiment of the present disclosure.

An example of a process 144 for implementing front-end circuitry 32 including a driver integrated circuit 76 is described in FIG. 14. Generally, the process 144 includes implementing a driver integrated circuit (process block 146), connecting the driver integrated circuit to a transceiver integrated circuit (process block 148), and connecting the driver integrated circuit to an antenna integrated circuit (process block 150). Although described in a particular order, which represents a particular embodiment, it should be noted that the process 144 may be performed in any suitable order. Additionally, embodiments of the process 144 may omit process blocks and/or include additional process blocks. Moreover, in some embodiments, the process 144 may be implemented at least in part by a manufacturer and/or a system integrator, for example, during manufacture of a radio frequency system 12 and/or an electronic device 10 including the radio frequency system 12.

As described above, a driver integrated circuit 76 may be implemented in front-end circuitry 32 of a radio frequency system 12 as an integrated circuit, for example, distinct and/or separate from a transceiver integrated circuit 74 implemented in the front-end circuitry 32 (process block 146). In particular, implementing the front-end circuitry 32 in this manner may enable the driver integrated circuit 76 and the transceiver integrated circuit 74 to be implemented (e.g., manufactured) at least in part using different semiconductor manufacturing techniques, which, at least in some instances, provide varying tradeoffs. For example, to facilitate reducing implementation associated cost, the transceiver integrated circuit 74C may be implemented using bulk CMOS manufacturing techniques. Additionally, to facilitate improving communication reliability, the driver integrated circuit 76 may be implemented at least in part using a different semiconductor manufacturing technique, such as a radio frequency (RF) silicon-on-insulator (SOI) manufacturing technique, a gallium arsenide (GaAs) manufacturing technique, another embedded passive manufacturing technique, a surface mounted technology (SMD) technique, or any combination thereof.

Figure 15:
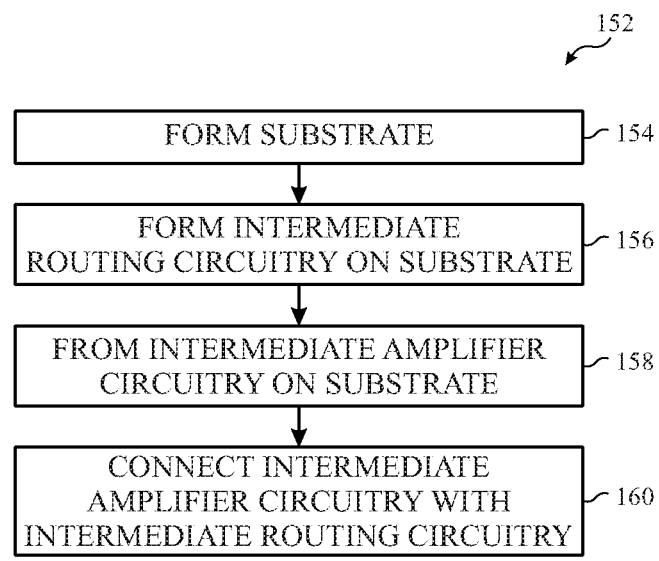
FIG. 15 is a flow diagram of an example process for implementing the driver integrated circuit of FIG. 7, in accordance with an embodiment of the present disclosure.

To help further illustrate, an example of a process 152 for implementing a driver integrated circuit 76 is described in FIG. 15. Generally, the process 152 includes forming a substrate (process block 154), forming intermediate routing circuitry on the substrate (process block 156), forming intermediate amplifier circuitry on the substrate (process block 158), and connecting the intermediate amplifier circuitry to the intermediate routing circuitry (process block 158). Although described in a particular order, which represents a particular embodiment, it should be noted that the process 152 may be performed in any suitable order. Additionally, embodiments of the process 152 may omit process blocks and/or include additional process blocks. Moreover, in some embodiments, the process 152 may be implemented at least in part by a manufacturer and/or a system integrator, for example, during manufacture of a radio frequency system 12 and/or an electronic device 10 including the radio frequency system 12.

In some embodiments, a substrate for a driver integrated circuit 76 may be formed from a semiconductor material (process block 154). For example, the substrate may be formed using gallium arsenide (GaAs). Additionally or alternatively, the substrate may be formed at least in part using silicon (Si). To facilitate improving amplifier performance (e.g., improve linearity and/or reduce power consumption), in some embodiments, one or more passive (e.g., dielectric or insulating) layers may be embedded in the substrate, for example, below a thin upper layer of silicon. As an illustrative example, a first (e.g., top) passive layer (e.g., adjacent the thing upper silicon layer) may be formed from a silicon oxide or sapphire. Additionally or alternatively, a second (e.g., bottom) passive layer may be a trap-rich layer, for example, formed from polysilicon.

After the substrate is formed, intermediate routing circuitry 86 may formed on the substrate (process block 154). In other words, in some embodiments, forming the intermediate routing circuitry 86 may include forming filter circuitry to be used to implement a filter 68, switching circuitry to be used to implement a routing switching device 66, splitter circuitry to be used to implement a splitter 70, combiner circuitry to be used to implement a combiner 72, or any combination therefor. Additionally, in some embodiments, the intermediate routing circuitry 86 may be formed by depositing material on the substrate and/or selectively removing (e.g., etching) material deposited on the substrate. Furthermore, in some embodiments, the intermediate routing circuitry may be formed by coupling one or more surface mounted devices (SMDs) (e.g., discrete components) to the substrate.

Additionally, intermediate amplifier circuitry to be used to implement one or more intermediate amplifier units 84 may be formed on the substrate (process block 156). In other words, in some embodiments, forming the intermediate amplifier circuitry may include forming transmit amplifier circuitry to be used to implement a transmit amplifier 58, receipt amplifier circuitry to be used to implement a receipt amplifier 62, first switching device circuitry to be used to implement a transmit amplifier switching device 60, second switching device circuitry to be used to implement a receipt amplifier switching device 64. Additionally, in some embodiments, the intermediate amplifier circuitry may be formed by depositing material on the substrate and/or selectively removing (e.g., etching) material deposited on the substrate. Furthermore, in some embodiments, one or more of the intermediate amplifier units 84 may be implemented using gallium arsenide (GaAs) amplifiers, which, at least in some instances, may provide better amplifier performance (e.g., linearity and/or power consumption) compared to bulk CMOS amplifiers.

As described above, implementing a driver integrated circuit 76 as a distinct integrated circuit (e.g., enclosed in housing or packing) in front-end circuitry 32 may enable the driver integrated circuit 76 to be implemented at least in part using a semiconductor manufacturing technique different from a transceiver integrate circuit 74 in the front-end circuitry 32. Thus, in some embodiments, the intermediate routing circuitry 86 and the intermediate amplifier circuitry may be implemented using the same semiconductor manufacturing technique. However, in other embodiments, the intermediate routing circuitry 86 and the intermediate amplifier circuitry may be implemented using different same semiconductor manufacturing techniques.

In fact, in some embodiments, a portion of the driver integrated circuit 76 may be implemented using the same semiconductor manufacturing technique as the transceiver integrated circuit 74. In other words, in some embodiments, a first portion (e.g., intermediate routing circuitry 86) of the driver integrated circuit 76 may be implemented using a different semiconductor technique while a second portion (e.g., intermediate amplifier units 84) is implemented using the same semiconductor manufacturing technique as the transceiver integrated circuit 74. For example, the intermediate amplifier circuitry may be implemented using a bulk CMOS manufacturing technique and, thus, formed on a bulk CMOS die. On the other hand, the intermediate routing circuitry 86 may be implemented via one or more surface mounted devices (SMDs) coupled to the bulk CMOS die.

To implement the driver integrated circuit 76, the intermediate amplifier circuitry may be connected to the intermediate routing circuitry 86 (process block 160). In other words, in some embodiments, electrically connecting the intermediate routing circuitry 86 and the intermediate amplifier circuitry may include electrically coupling the intermediate amplifier circuitry to the filter circuitry to be used to implement the filter 68 and/or the switching circuitry to be used to implement the routing switching device 66. Additionally or alternatively, electrically connecting the intermediate routing circuitry 86 and the intermediate amplifier circuitry may include electrically coupling the intermediate amplifier circuitry between the splitter circuitry to be used to implement the splitter 70 and the combiner circuitry to be used to implement a combiner 72.

Furthermore, in some embodiments, electrically connecting the intermediate routing circuitry 86 and the intermediate amplifier circuitry may include forming conductive traces therebetween, for example, by depositing and/or etching conductive material on the substrate (process block 160). Additionally or alternatively, electrically connecting the intermediate routing circuitry 86 and the intermediate amplifier circuitry may include coupling an electrical connector 92 (e.g., wire) between different portions of the driver integrated circuit 76, for example, when the intermediate amplifier circuitry is formed on a bulk CMOS die and the intermediate routing circuitry 86 is implemented at least in part via a surface mounted device (SMD) or component.

To enable data communication with a transceiver integrated circuit 74 and/or an antenna integrated circuit 78, in some embodiments, the driver integrated circuit 76 may include one or more I/O ports 16 (e.g., pins or pads). As such, in some embodiments, implementing the driver integrated circuit 76 may include electrically connecting the intermediate routing circuitry 86 to the one or more I/O ports 16. To facilitate reducing likelihood of communication via an I/O port 16 affecting communication reliability, in some embodiments, the driver integrated circuit 76 may be implemented such that impedance of the I/O port 16 is below a threshold impedance (e.g., fifty ohms) and/or a complex impedance.

As described above, in some embodiments, a driver integrated circuit 76 may include electromagnetic shielding to facilitate reducing likelihood of electromagnetic interference inducing electrical current conductive material of the driver integrated circuit 76 and/or magnitude of the induced electrical current. Thus, in some embodiments, implementing the driver integrated circuit 76 may include forming electromagnetic shielding around at least a portion of the intermediate routing circuitry 86 and/or the intermediate amplifier circuitry. For example, the electromagnetic shield may be disposed on or formed as a housing (e.g., packaging) surrounding the intermediate routing circuitry 86 and/or the intermediate amplifier circuitry. In this manner, a driver integrated circuit 76 may implemented as an integrated circuit, for example, distinct from a transceiver integrated circuit 74.

Returning to the process 144 of FIG. 14, the driver integrated circuit 76 may be coupled to a transceiver integrated circuit 74 (process block 148). As described above, in some embodiments, the transceiver integrated circuit 74 may be implemented at least in part using a different semiconductor manufacturing technique compared to the driver integrated circuit 76. For example, to facilitate reducing implementation associated cost, the transceiver integrated circuit 74C may be implemented using bulk CMOS manufacturing techniques while the driver integrated circuit 76 is implemented using RF-SOI manufacturing techniques.

Additionally, as described above, in some embodiments, the driver integrated circuit 76 and the transceiver integrated circuit 74 may be implemented in close proximity to one another to facilitate reducing loss resulting from communication therebetween. In fact, in some embodiments, implementing the driver integrated circuit 76 and the transceiver integrated circuit 74 in close proximity may enable the driver integrated circuit 76 and the transceiver integrated circuit 74 to be directly connected (e.g., via I/O ports 16), thereby obviating electrical connectors 92 and, thus, resulting connector loss.

On the its opposite side, the driver integrated circuit 76 may be connected to an antenna 34, for example, implemented on an antenna integrated circuit 78 via one or more electrical connectors 92 (process block 150). In some embodiments, one or more antenna integrated circuit 78 may be implemented at least in part using the same semiconductor manufacturing technique as the driver integrated circuit 76. For example, an antenna integrated circuit 78 and the driver integrated circuit 76 may both be implemented using RF-SOI manufacturing techniques. In other embodiments, one or more antenna integrated circuit 78 may be implemented using a different semiconductor manufacturing technique. For example, the driver integrated circuit 76 may be implemented using RF-SOI manufacturing techniques while an antenna integrated circuit 78 is implemented using a different embedded passive manufacturing technique or a bulk CMOS manufacturing technique. In this manner, front-end circuitry 32 including a driver integrated circuit 76 may be implemented in a radio frequency system 12.

Accordingly, the technical effects of the techniques described in the present disclosure include improving operational efficiency and/or communication reliability of a radio frequency system and, thus, an electronic device in which the radio frequency system is implemented. For example, implementing and/or operating front-end circuitry in the manner described above may enable gain applied to control output power of to be divided (e.g., split) between the driver integrated circuit and an antenna integrated circuit. As such, gain applied at the antenna integrated circuit may be reduced, which, at least in some instances may facilitate improving communication reliability, for example, by reducing likelihood of the gain applied in the antenna integrated circuit producing noise oscillations. Additionally or alternatively, implementing and/or operating front-end circuitry in the manner described above may facilitate compensating for connector loss on the transceiver-side of an electrical connector, which, at least in some instances may facilitate improving communication reliability, for example, by improving ability of filtering to distinguish between a data portion and a noise portion of an analog electrical signal.

The specific embodiments described above have been shown by way of example, and it should be understood that these embodiments may be susceptible to various modifications and alternative forms. It should be further understood that the claims are not intended to be limited to the particular forms disclosed, but rather to cover all modifications, equivalents, and alternatives falling within the spirit and scope of this disclosure.

What is claimed is:

1. A radio frequency system to be deployed in an electronic device comprising:
    an antenna integrated circuit, wherein the antenna integrated circuit comprises an antenna and an antenna amplifier unit configured to facilitate wirelessly communicating data;
    a transceiver integrated circuit comprising a transceiver amplifier unit, wherein the transceiver integrated circuit is implemented at least in part using a first semiconductor manufacturing technique; and
    a driver integrated circuit coupled between the transceiver integrated circuit and the antenna integrated circuit, wherein:
    the driver integrated circuit is implemented at least in part using a second semiconductor manufacturing technique different from the first semiconductor manufacturing technique; and
    the driver integrated circuit comprises an intermediate amplifier unit and intermediate routing circuitry coupled to the intermediate amplifier unit to facilitate communication of the data between the transceiver integrated circuit and the antenna integrated circuit.

2. The radio frequency system of claim 1, wherein:
    the transceiver amplifier unit of the transceiver integrated circuit is configured to generate a first amplified analog electrical signal that indicates the data;
    the intermediate amplifier unit of the driver integrated circuit is configured to amplify the first amplified analog electrical signal output from the transceiver integrated circuit to generate a second amplified analog electrical signal that indicates the data;
    the intermediate routing circuitry of the driver integrated circuit is configured to route the first amplified analog electrical signal output from the transceiver amplifier unit to the intermediate amplifier unit and the second amplified analog electrical signal output from the intermediate amplifier unit to the antenna integrated circuit;
    the antenna amplifier unit of the antenna integrated circuit is configured to amplify the second amplified analog electrical signal output from the intermediate amplifier unit to generate a third amplified analog electrical signal that indicates the data; and
    the antenna of the antenna integrated circuit is configured to wirelessly transmit the data to another radio frequency system, a communication network, or both at least in part by modulating electromagnetic waves based on the third amplified analog electrical signal generated by the antenna amplifier unit.

3. The radio frequency system of claim 2, wherein:
    the transceiver integrated circuit is configured to output a fourth amplified analog electrical signal that indicates other data to be wirelessly transmitted concurrently with the data;
    the driver integrated circuit comprises another intermediate driver unit configured to amplify the fourth amplified analog electrical signal output from the transceiver integrated circuit to generate a fifth amplified analog electrical signal that indicates the other data;
    the antenna integrated circuit comprises another antenna amplifier unit configured to amplify the fifth amplified analog electrical signal output from the other intermediate driver unit to generate a sixth amplified analog electrical signal that indicates the other data; and the antenna of the antenna integrated circuit is configured to concurrently wirelessly transmit the data and the other data at least in part by:

modulating horizontally polarized electromagnetic waves based at least in part on the third amplified analog electrical signal that indicates the data; and modulating vertically polarized electromagnetic waves based on the sixth amplified analog electrical signal that indicates the other data.

4. The radio frequency system of claim 1, wherein:

the antenna of the antenna integrated circuit is configured to wirelessly receive the data from another radio frequency system, a communication network, or both at least in part by outputting an analog electrical signal based on incident electromagnetic waves;

the antenna amplifier unit of the antenna integrated circuit is configured to amplify the analog electrical signal output from the antenna to generate a first amplified analog electrical signal that indicates the data;

the intermediate amplifier unit of the driver integrated circuit is configured to amplify the first amplified analog electrical signal output from the antenna amplifier unit to generate a second amplified analog electrical signal that indicates the data;

the intermediate routing circuitry of the driver integrated circuit is configured to route the first amplified analog electrical signal output from the antenna amplifier unit to the intermediate amplifier unit and the second amplified analog electrical signal output from the intermediate amplifier unit to the transceiver integrated circuit; and the transceiver amplifier unit of the transceiver integrated circuit is configured to amplify the second amplified analog electrical signal output from the intermediate amplifier unit to generate a third amplified analog electrical signal that indicates the data.

5. The radio frequency system of claim 4, wherein:

the antenna of the antenna integrated circuit is configured to wirelessly receive the data concurrently with other data at least in part by:

outputting the analog electrical signal that indicates the data based on horizontally polarized electromagnetic waves incident on the antenna; and outputting another analog electrical signal that indicates the other data based on vertically polarized electromagnetic waves incident on the antenna;

the antenna integrated circuit comprises another antenna amplifier unit configured to amplify the other analog electrical signal output from the antenna to generate a fourth amplified analog electrical signal that indicates the other data; and the driver integrated circuit comprises another intermediate driver unit configured to amplify the fourth amplified analog electrical signal output from the other antenna amplifier unit to generate a fifth amplified analog electrical signal that indicates the other data.

6. The radio frequency system of claim 1, wherein:

the first semiconductor manufacturing techniques comprises a bulk complementary metal-oxide-semiconductor (CMOS) manufacturing technique; and the second semiconductor manufacturing technique comprises a radio frequency silicon-on-insulator (RF-SOI) manufacturing technique, a gallium arsenide (GaAs) manufacturing technique, or another embedded passive manufacturing technique.

7. The radio frequency system of claim 1, wherein:

the intermediate amplifier unit of the driver integrated circuit is configured to amplify a first frequency component of the data to generate a first amplified analog electrical signal;

the driver integrated circuit comprises another intermediate amplifier unit configured to amplify a second frequency component of the data to generate a second amplified analog electrical signal; and the intermediate routing circuitry of the driver integrated circuit comprises combiner circuitry configured to combine the first analog electrical signal output from the intermediate amplifier unit and the second analog electrical signal output from the other intermediate amplifier unit into a single analog electrical signal before output from the driver integrated circuit.

8. The radio frequency system of claim 1, wherein:

the driver integrated circuit is configured to receive an analog electrical signal that indicates the data using a first frequency component and a second frequency component different from the first frequency component; and the intermediate routing circuitry of the driver integrated circuit comprises filter circuitry configured to filter the analog electrical signal such that:

the first frequency component is routed to the intermediate amplifier unit to enable the intermediate amplifier unit to generate a first amplified analog electrical signal that indicates the first frequency component of the data; and the second frequency component is routed to another intermediate amplifier unit of the driver integrated circuit to enable the other intermediate amplifier unit to generate a second amplified analog electrical signal that indicates the second frequency component of the data.

9. The radio frequency system of claim 1, comprising another antenna integrated circuit, wherein:

the other antenna integrated circuit comprises another antenna and another antenna amplifier unit configured to facilitate wirelessly transmitting the data;

the driver integrated circuit is configured to receive an analog electrical signal that indicates the data to be wireless transmitted from the transceiver integrated circuit; and the intermediate routing circuitry of the driver integrated circuit comprises splitter circuitry configured to split the analog electrical signal such that:

a first version is routed to the intermediate amplifier unit to enable the intermediate amplifier unit to generate a first amplified analog electrical signal to be supplied to the antenna integrated circuit that indicates the data; and a second version is routed to another intermediate amplifier unit of the driver integrated circuit to enable the other intermediate amplifier unit to generate a second amplified analog electrical signal to be supplied to the other antenna integrated circuit that indicates the data.

10. The radio frequency system of claim 9, comprising phase-shift circuitry configured to phase-shift one or more analog electrical signals that indicate the data before supply to the antenna of the antenna integrated circuit, the other antenna of the other antenna integrated circuit, or both to facilitate wirelessly transmitting the data via a beam of electromagnetic waves.

11. A method of operating a radio frequency system, comprising:
- receiving, using a driver integrated circuit of the radio frequency system, one or more analog electrical signals output from a transceiver integrated circuit of the radio frequency system to indicate first data in a first data stream and second data in a second data stream to be concurrently wirelessly transmitted from the radio frequency system;
- routing, using the driver integrated circuit, a first analog electrical signal that indicates the first data to a first intermediate amplifier unit of the driver integrated circuit to enable the first intermediate amplifier unit to amplify the first analog electrical signal;
- routing, using the driver integrated circuit, a second analog electrical signal that indicates the second data to a second intermediate amplifier unit of the driver integrated circuit to enable the second intermediate amplifier unit to amplify the second analog electrical signal; and
- outputting, using the driver integrated circuit, the first analog electrical signal after amplification by the first intermediate amplifier unit and the second analog electrical signal after application by the second intermediate amplifier unit to an antenna integrated circuit to enable an antenna of the antenna integrated circuit to concurrently transmit the first data of the first data stream and the second data of the second data stream at least in part by:
- modulating horizontally polarized electromagnetic waves based at least in part on the first analog electrical signal that indicates the first data in the first data stream; and
- modulating vertically polarized electromagnetic waves based on the second analog electrical signal that indicates the second data in the second data stream.

12. The method of claim 11, comprising:
- routing, using the driver integrated circuit, the first analog electrical signal that indicates the first data to a third intermediate amplifier unit of the driver integrated circuit to enable the third intermediate amplifier unit to amplify the first analog electrical signal;
- routing, using the driver integrated circuit, the second analog electrical signal that indicates the second data to a fourth intermediate amplifier unit of the driver integrated circuit to enable the fourth intermediate amplifier unit to amplify the second analog electrical signal; and
- outputting, using the driver integrated circuit, the first analog electrical signal after amplification by the third intermediate amplifier unit and the second analog electrical signal after application by the fourth intermediate amplifier unit to another antenna integrated circuit to enable another antenna of the other antenna integrated circuit to concurrently transmit the first data of the first data stream and the second data of the second data stream at least in part by:
- modulating horizontally polarized electromagnetic waves based at least in part on the first analog electrical signal that indicates the first data in the first data stream; and
- modulating vertically polarized electromagnetic waves based on the second analog electrical signal that indicates the second data in the second data stream.

13. The method of claim 11, wherein routing the first analog electrical signal to the first intermediate amplifier unit comprises filtering the one or more analog electrical signal received from the transceiver integrated circuit to identify the first analog electrical signal that indicates the first data of the first data stream.

14. The method of claim 11, wherein outputting the first analog electrical signal comprises:
- combining the first analog electrical signal after amplification by the first intermediate amplifier unit with another analog electrical signal corresponding with a different frequency component in the first data stream to generate a combined analog electrical signal; and
- outputting the combined analog electrical signal to the antenna integrated circuit.

15. The method of claim 11, wherein the driver integrated circuit is implemented at least in part using a first semiconductor manufacturing technique different from a second semiconductor manufacturing technique used to implement the transceiver integrated circuit.

16. A driver integrated circuit to be deployed in a radio frequency system, comprising:
- intermediate routing circuitry configured to be communicatively coupled between a transceiver integrated circuit and an antenna of the radio frequency system, wherein the driver integrated circuit is implemented at least in part using a different semiconductor manufacturing technique compared to the transceiver integrated circuit;
- a first intermediate amplifier unit coupled to the intermediate routing circuitry, wherein the intermediate routing circuitry is configured to route a first analog electrical signal that indicates first data to be wirelessly transmitted from the radio frequency system to the first intermediate amplifier unit and the first intermediate amplifier unit is configured to amplify the first analog electrical signal that indicates the first data; and
- a second intermediate amplifier unit coupled to the intermediate routing circuitry, wherein the intermediate routing circuitry is configured to route a second analog electrical signal that indicates second data to be wirelessly transmitted from the radio frequency system concurrently with the first data to the second intermediate amplifier unit and the second intermediate amplifier unit is configured to amplify the second analog electrical signal that indicates second data.

17. The driver integrated circuit of claim 16, wherein:
- the first data is included in a first data stream and the second data is included in a second data stream different from the first data stream; and
- the intermediate routing circuitry is configured to output the first analog electrical signal after amplification by the first intermediate amplifier unit and the second analog electrical signal after amplification by the second intermediate amplifier unit to the antenna to enable the antenna to concurrently wirelessly transmit the first data stream and the second data stream at least in part by:
- modulating horizontally polarized electromagnetic waves based at least in part on the first analog electrical signal that indicates the first data in the first data stream; and
- modulating vertically polarized electromagnetic waves based on the second analog electrical signal that indicates the second data in the second data stream.

18. The driver integrated circuit of claim 16, wherein:
- the first data is included in a first frequency component of a data stream and the second data is included in a second frequency component of the data stream different from the first frequency component; and the intermediate routing circuitry comprises filter circuitry configured to:

receive a combined analog electrical signal output from the transceiver integrated circuit, wherein the combined analog electrical signal comprises the first frequency component and the second frequency component; and filter the combined analog electrical signal to identify the first analog electrical signal corresponding with the first frequency component of the data stream and the second analog electrical signal corresponding with the second frequency component of the data stream.

19. The driver integrated circuit of claim 16, wherein:

the first data is included in a first frequency component of a data stream and the second data is included in a second frequency component of the data stream different from the first frequency component; and the intermediate routing circuitry comprises combiner circuitry configured to:

combine the first analog electrical signal after amplification by the first intermediate amplifier unit and the second analog electrical signal after amplification by the second intermediate amplifier unit to generate a combined analog electrical signal; and outputting the combined analog electrical signal to enable the antenna to concurrently transmit the first frequency component and the second frequency component of the data stream.

20. The driver integrated circuit of claim 16, the driver integrated circuit is implemented at least in part using a radio frequency silicon-on-insulator (RF-SOI) manufacturing technique, a gallium arsenide (GaAs) manufacturing technique, or another embedded passive manufacturing technique.

* * * * *